(12) United States Patent
Shimoda et al.

(10) Patent No.: US 10,400,336 B2
(45) Date of Patent: *Sep. 3, 2019

(54) OXIDE PRECURSOR, OXIDE LAYER, SEMICONDUCTOR ELEMENT, AND ELECTRONIC DEVICE, AND METHOD OF PRODUCING OXIDE LAYER AND METHOD OF PRODUCING SEMICONDUCTOR ELEMENT

(71) Applicants: Japan Advanced Institute of Science and Technology, Ishikawa (JP); Sumitomo Seika Chemicals Co., Ltd., Hyogo (JP)

(72) Inventors: Tatsuya Shimoda, Ishikawa (JP); Satoshi Inoue, Ishikawa (JP); Kazuhiro Fukada, Ishikawa (JP); Kiyoshi Nishioka, Hyogo (JP); Nobutaka Fujimoto, Osaka (JP); Masahiro Suzuki, Hyogo (JP)

(73) Assignees: JAPAN ADVANCED INSTITUTE OF SCIENCE AND TECHNOLOGY, Ishikawa (JP); SUMITOMO SEIKA CHEMICALS CO., LTD., Hyogo (JP)

( * ) Notice: Subject to any disclaimer, the term of this patent is extended or adjusted under 35 U.S.C. 154(b) by 258 days.

This patent is subject to a terminal disclaimer.

(21) Appl. No.: 15/532,769

(22) PCT Filed: Oct. 5, 2015

(86) PCT No.: PCT/JP2015/078158
§ 371 (c)(1),
(2) Date: Jun. 2, 2017

(87) PCT Pub. No.: WO2016/098423
PCT Pub. Date: Jun. 23, 2016

(65) Prior Publication Data
US 2017/0335461 A1     Nov. 23, 2017

(30) Foreign Application Priority Data

Dec. 16, 2014 (JP) ................................. 2014-253552

(51) Int. Cl.
*B32B 3/00* (2006.01)
*C23C 18/12* (2006.01)
(Continued)

(52) U.S. Cl.
CPC .......... *C23C 18/1216* (2013.01); *C23C 18/12* (2013.01); *C23C 18/1279* (2013.01);
(Continued)

(58) Field of Classification Search
CPC ............ C23C 18/1216; C23C 18/1279; H01L 21/02244; H01L 21/02628; H01L 21/02255; H01L 21/02282
See application file for complete search history.

(56) References Cited

U.S. PATENT DOCUMENTS

| 7,560,049 B2 | 7/2009 | Newsome et al. |
| 2005/0008777 A1 | 1/2005 | McCleskey et al. |

(Continued)

FOREIGN PATENT DOCUMENTS

| EP | 3032576 A1 | 6/2016 |
| JP | 2007-134547 A | 5/2007 |

(Continued)

OTHER PUBLICATIONS

Supplementary European Search Report for EP Application No. 15869631 dated Mar. 23, 2018, 7 pp.
(Continued)

*Primary Examiner* — Elizabeth E Mulvaney
(74) *Attorney, Agent, or Firm* — Buckley, Maschoff & Talwalkar LLC

(57) ABSTRACT

An aliphatic polycarbonate, an oxide precursor, and an oxide layer are provided, which are capable of controlling stringi-
(Continued)

ness, when a thin film that can be employed for an electronic device or a semiconductor element is formed by a printing method. In an oxide precursor of the present invention, a compound of metal to be oxidized into a metal oxide is dispersed in a solution containing a binder (possibly including inevitable impurities) made of aliphatic polycarbonates, and an aliphatic polycarbonate having a molecular weight of 6000 or more and 400000 or less constitutes 80% by mass or more of all the aliphatic polycarbonates.

20 Claims, 14 Drawing Sheets

(51) Int. Cl.
H01L 21/288 (2006.01)
H01L 29/786 (2006.01)
H01L 21/02 (2006.01)

(52) U.S. Cl.
CPC .. *H01L 21/02244* (2013.01); *H01L 21/02255* (2013.01); *H01L 21/02565* (2013.01); *H01L 21/02628* (2013.01); *H01L 21/288* (2013.01); *H01L 29/786* (2013.01)

(56) References Cited

U.S. PATENT DOCUMENTS

2007/0102676 A1 5/2007 Lee et al.
2012/0146010 A1 6/2012 Ueno et al.
2012/0313055 A1 12/2012 Yukinobu et al.

FOREIGN PATENT DOCUMENTS

| JP | 2007-165900 A | 6/2007 |
| JP | 2007-201056 A | 8/2007 |
| JP | 2010-10549 A | 1/2010 |
| JP | 2011-119681 A | 6/2011 |
| JP | 2012-169404 A | 6/2012 |
| JP | 2012193073 A | 10/2012 |
| JP | 2013256437 A | 12/2013 |
| WO | 2006010914 A1 | 2/2006 |

OTHER PUBLICATIONS

International Search Report for PCT/JP2014/067960 dated Dec. 28, 2015, 2 pp.
Matoba et al., "Oxide Semiconductor/Polypropylene Carbonate Paste for a Thin-Film Transistor using Screen Printing", SID Digest 2015, 4 pp.
Japanese Office Action for JP Application No. 2015-552674 dated Nov. 1, 2018, 4 pp.
Translation of Japanese Office Action for JP Application No. 2015-552674 dated Dec. 27, 2018, 3 pp.
"Taiwanese Office Action" dated Jan. 11, 2019, TIPO, for Taiwanese Application No. 104135998, 5pp.
English-language Translation of Taiwanese Office Action, dated Jan. 11, 2019, TIPO, for Taiwanese Application No. 104135998, 3pp.

[Fig. 1]
(1) 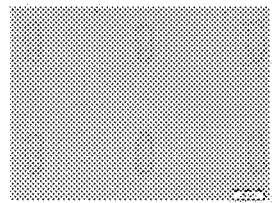  (7) 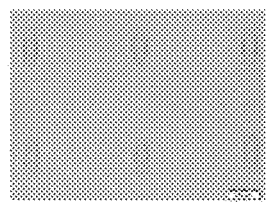  (8) 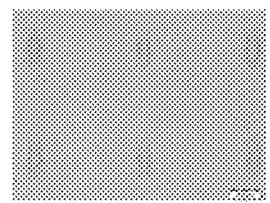
[Fig. 2A]
(5) 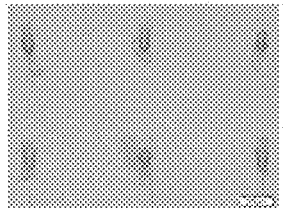  (9) 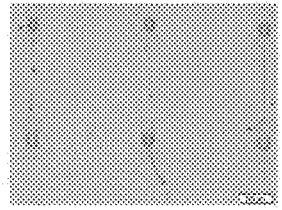  String-like matter (10) 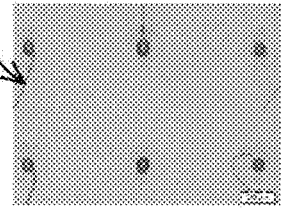

[Fig. 2B]
(9) 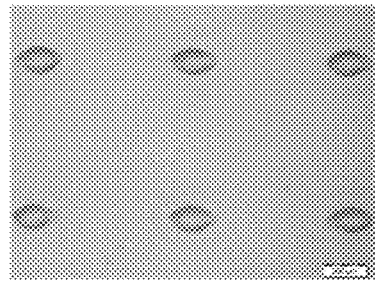   (10) 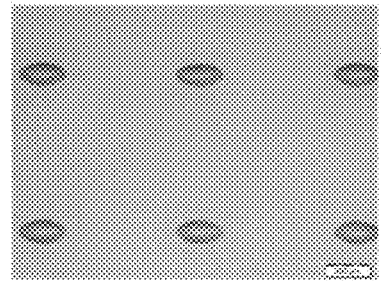

[Fig. 3A]
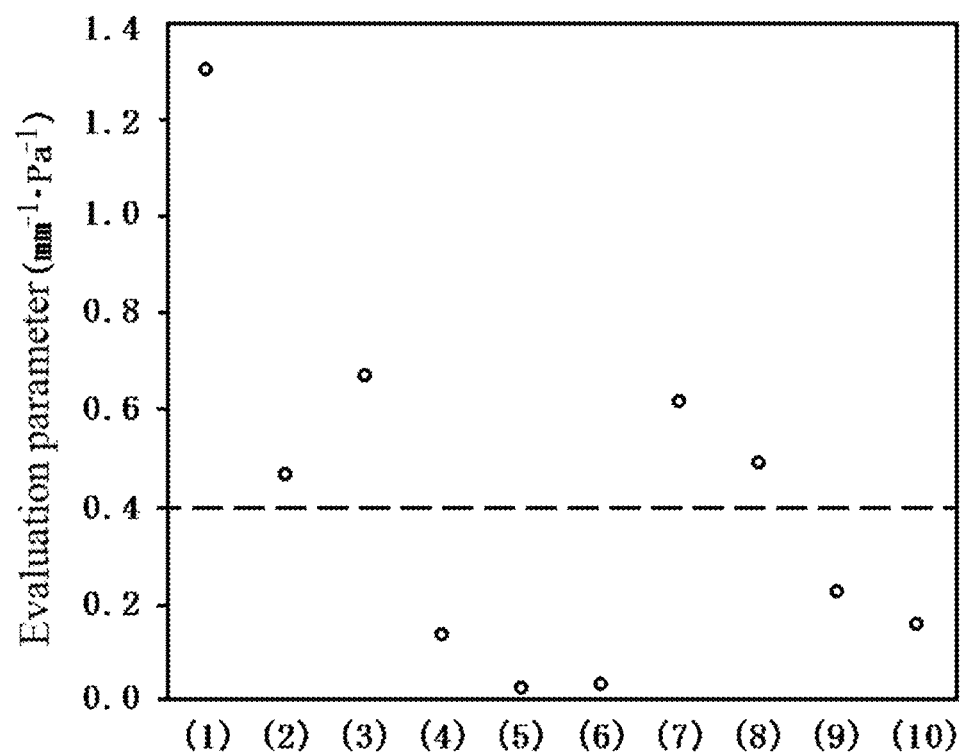

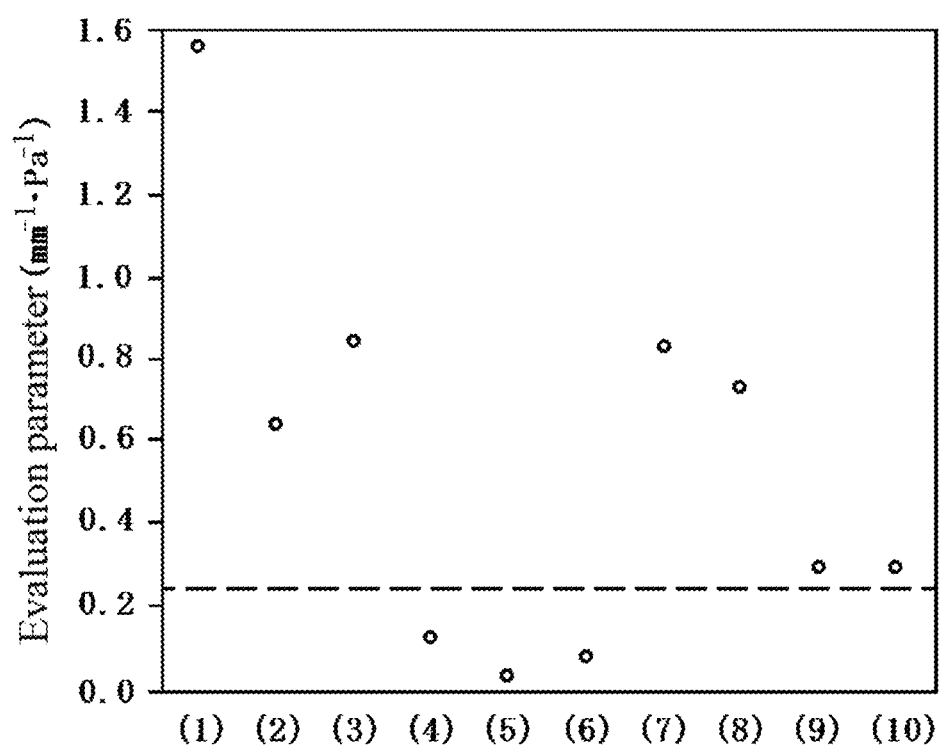
[Fig. 3B]

[Fig. 4A]
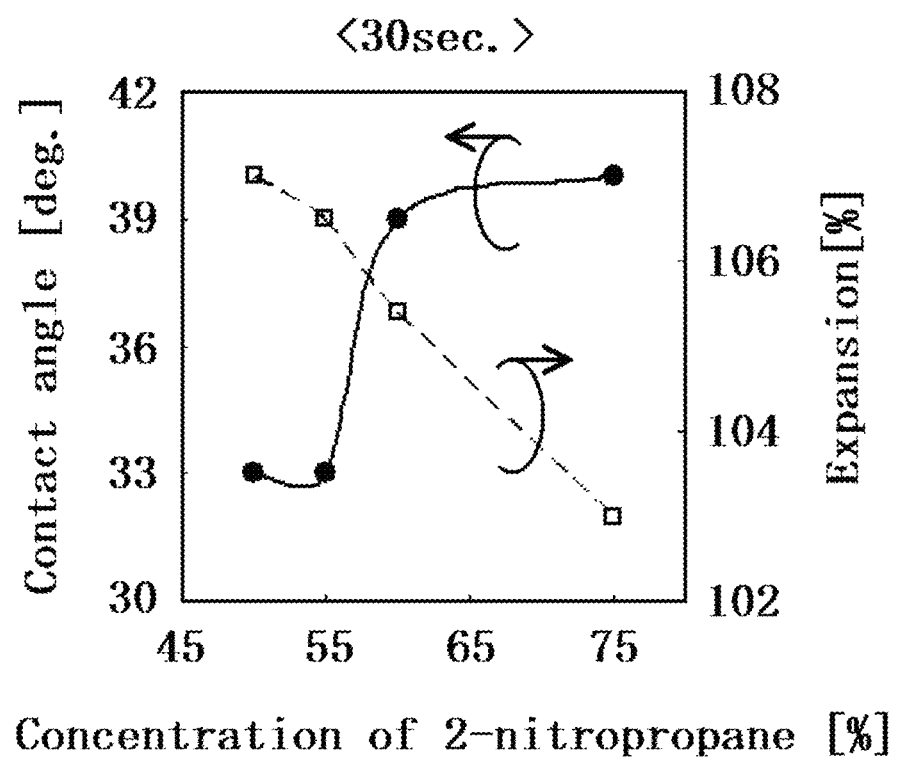

[Fig. 4B]
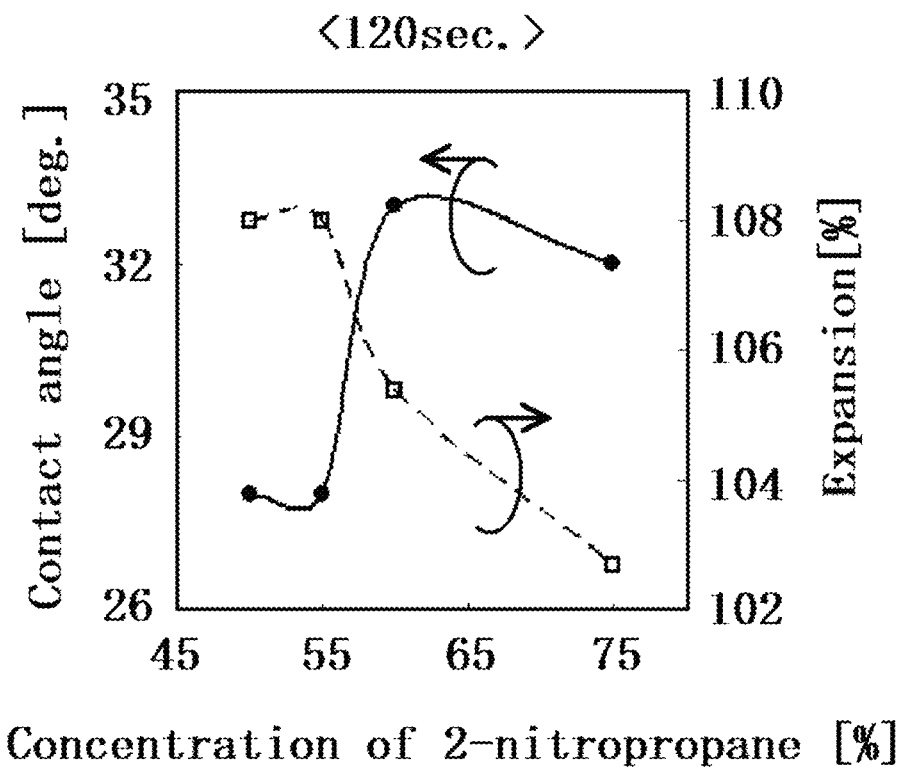
[Fig. 5]
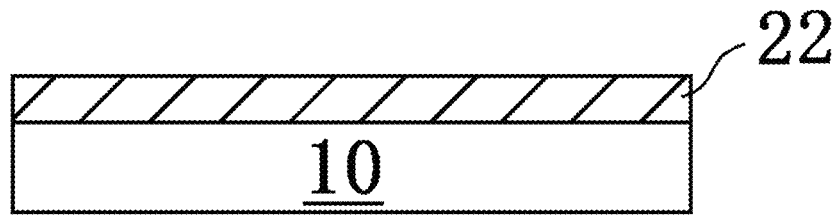

[Fig. 6]
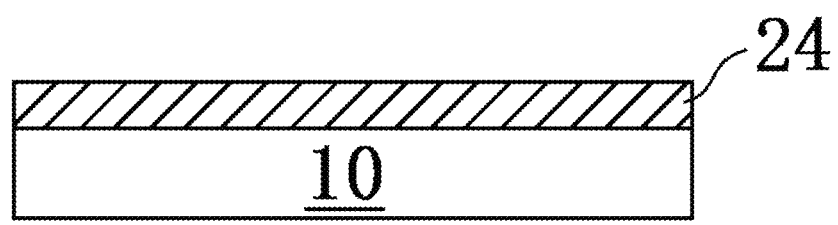
[Fig. 7]
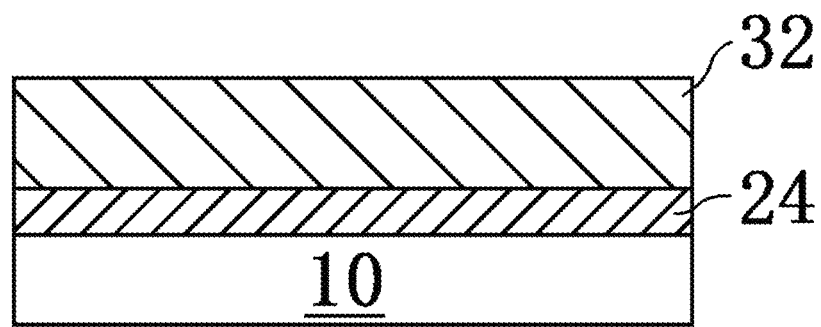

[Fig. 8]
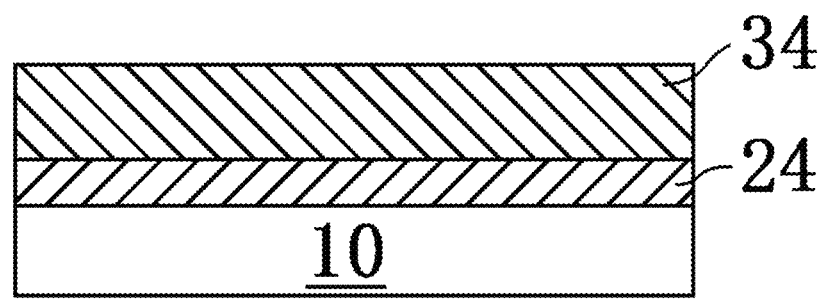
[Fig. 9]
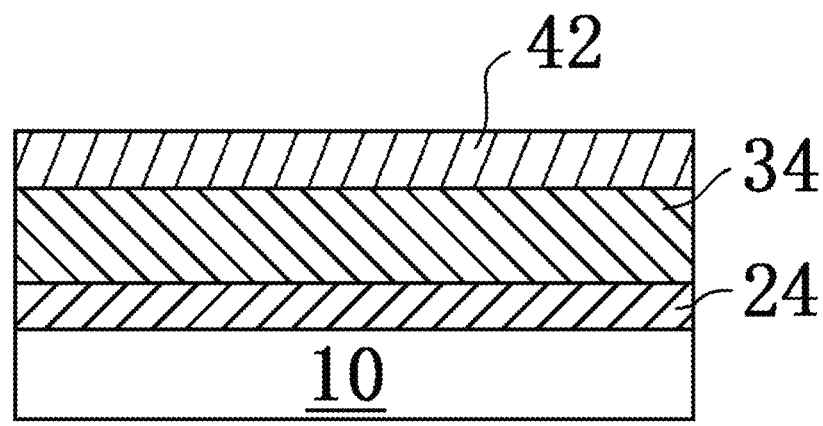

[Fig. 10]
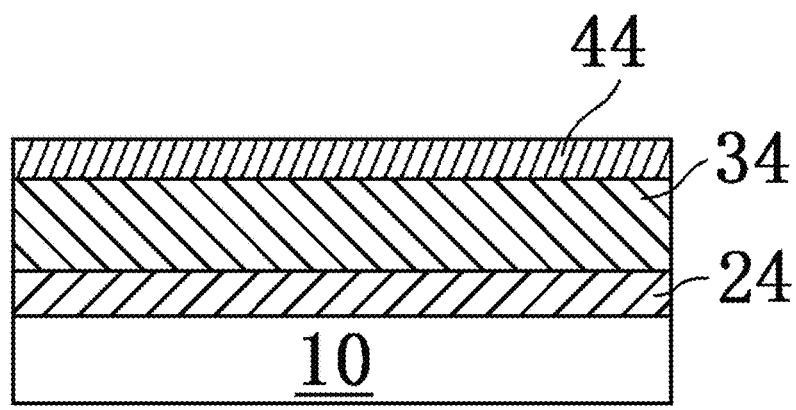
[Fig. 11]
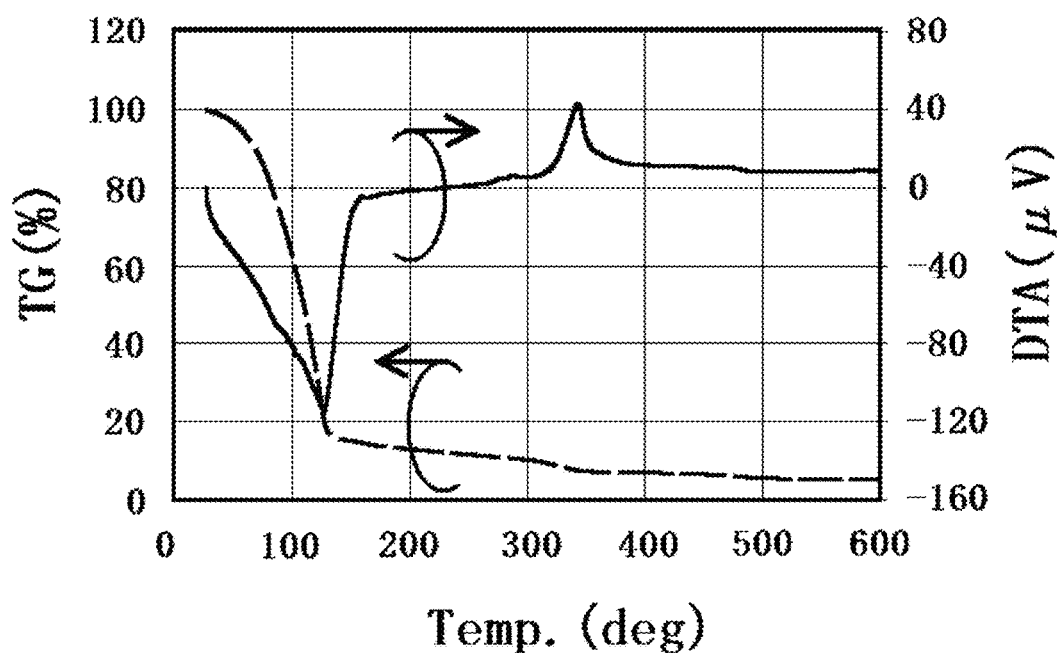

[Fig. 12A]
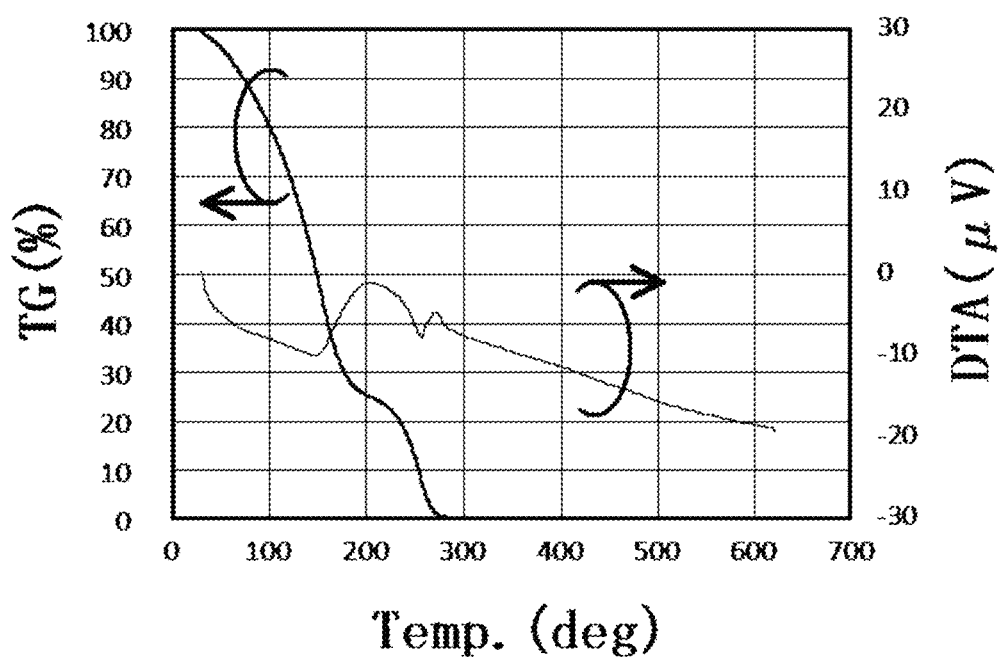

[Fig. 12B]
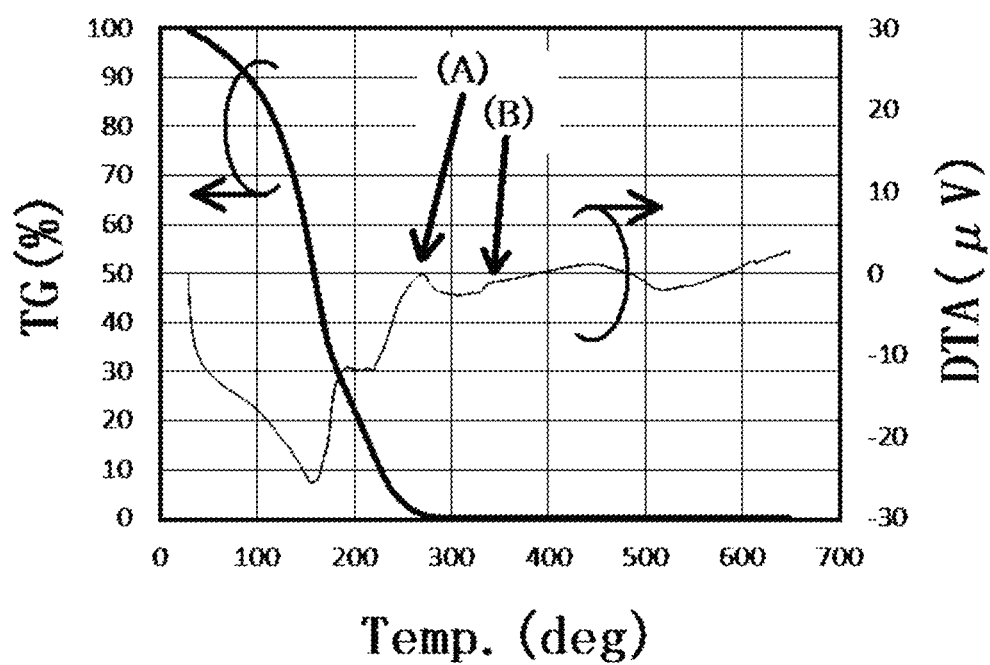

[Fig. 12C]
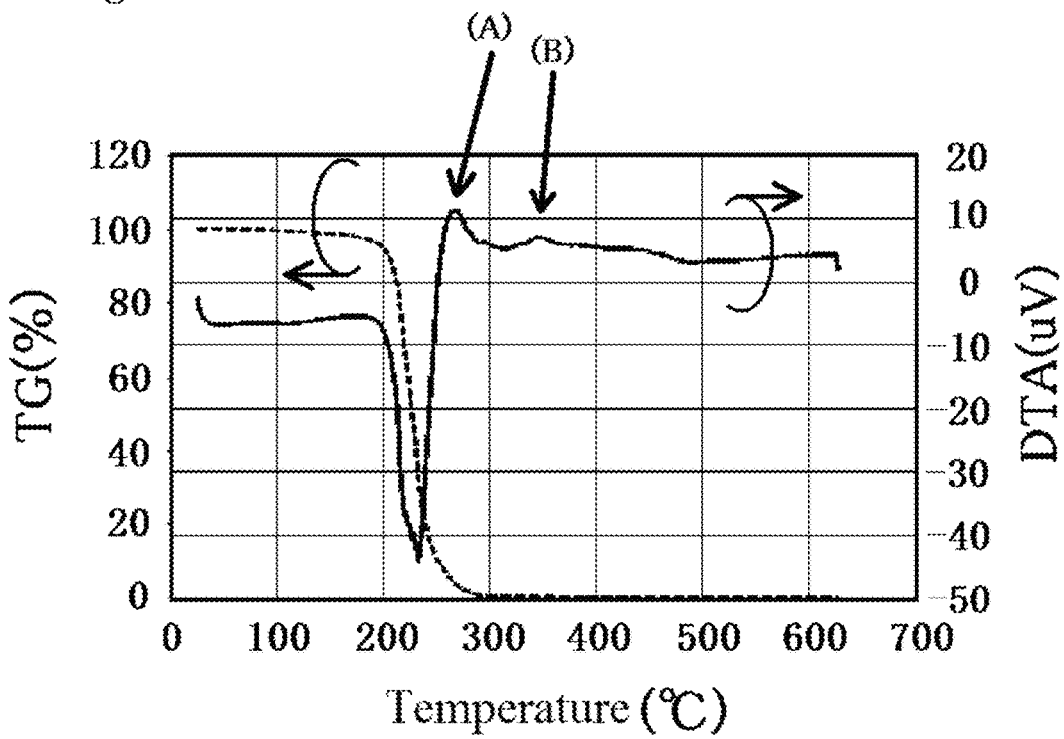
[Fig. 13]
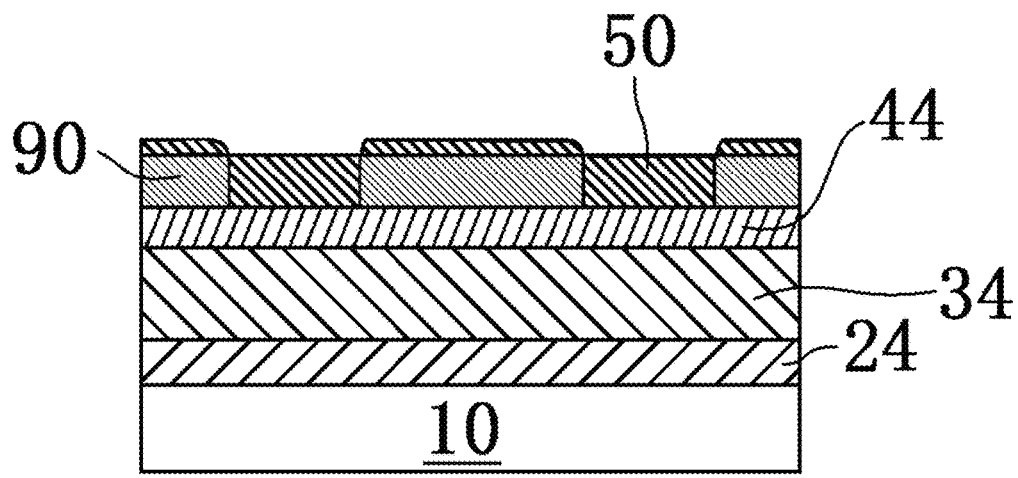

[Fig. 14]
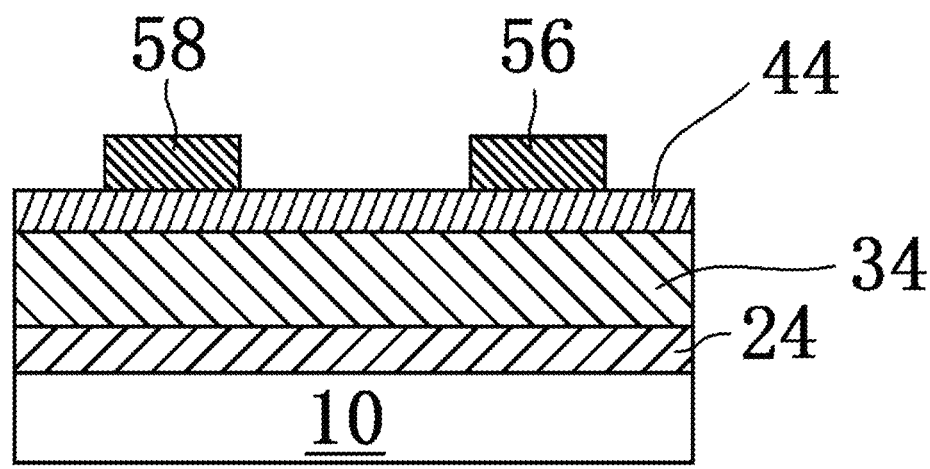
[Fig. 15]
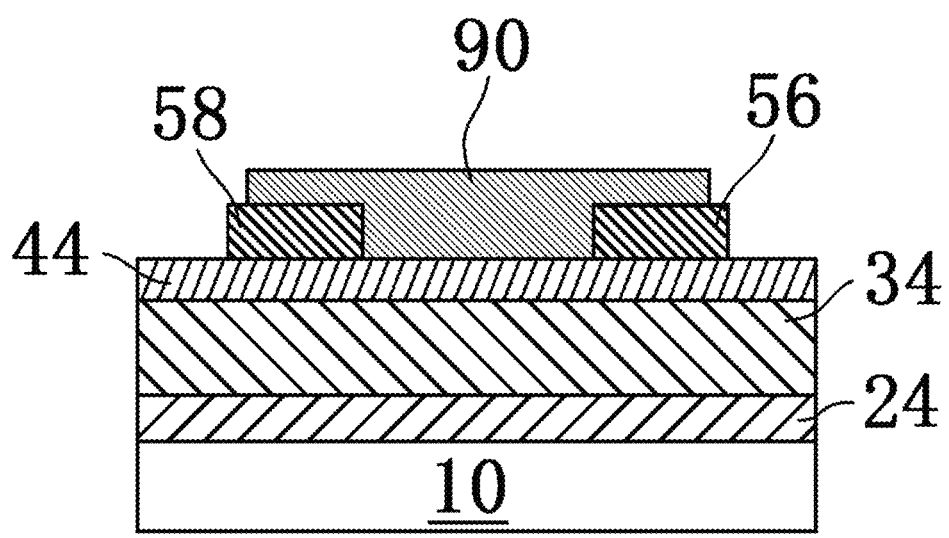

[Fig. 16]
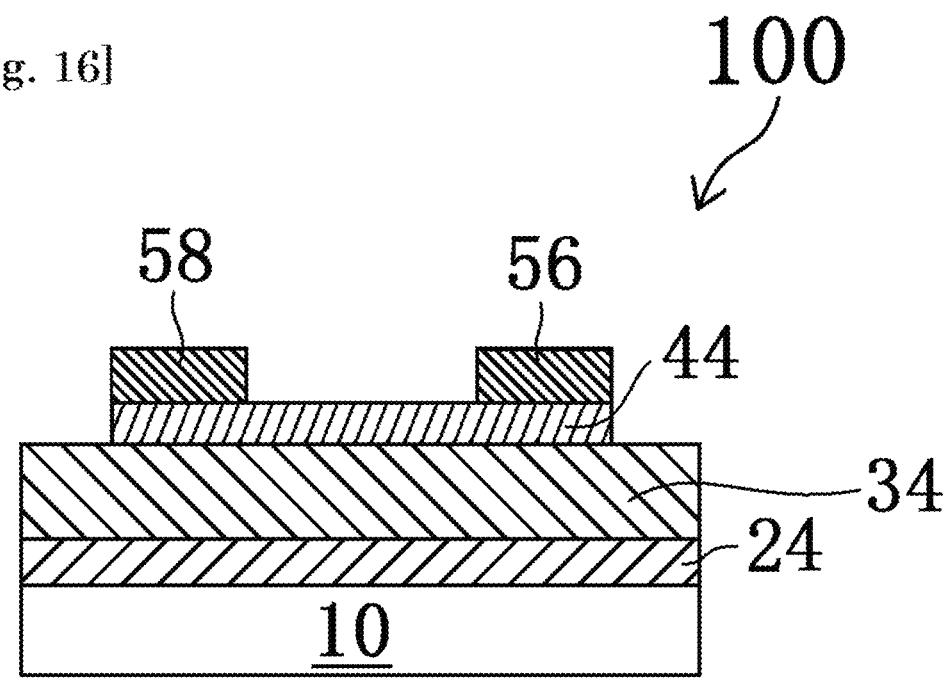
[Fig. 17]
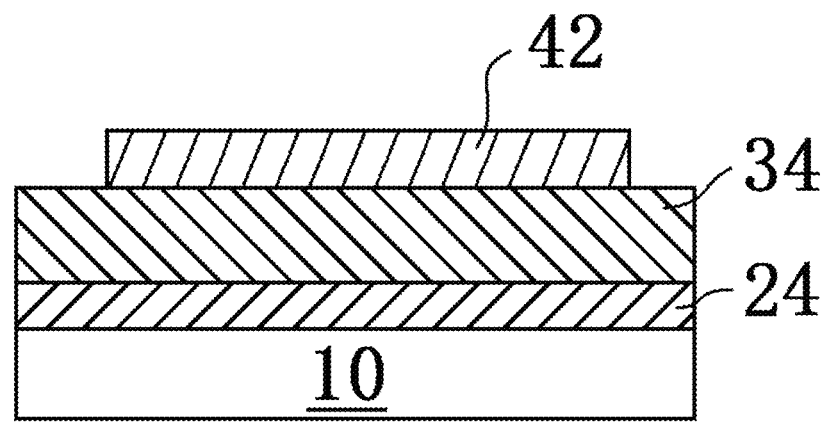

OXIDE PRECURSOR, OXIDE LAYER, SEMICONDUCTOR ELEMENT, AND ELECTRONIC DEVICE, AND METHOD OF PRODUCING OXIDE LAYER AND METHOD OF PRODUCING SEMICONDUCTOR ELEMENT

This application is a U.S. National Stage filing under 35 U.S.C. § 371 and 35 U.S.C § 119, based on and claiming priority to PCT/JP2015/078158 for "OXIDE PRECURSOR, OXIDE LAYER, SEMICONDUCTOR ELEMENT, ELECTRONIC DEVICE, METHOD OF PRODUCING OXIDE LAYER, AND METHOD OF PRODUCING SEMICONDUCTOR ELEMENT", filed Oct. 5, 2015, and JP Patent Application No. 2014-253552, filed Dec. 16, 2014.

TECHNICAL FIELD

The present invention relates to an oxide precursor, an oxide layer, a semiconductor element, and an electronic device, as well as a method of producing an oxide layer and a method of producing a semiconductor element.

BACKGROUND ART

Conventionally, a polycrystalline silicon film or an amorphous silicon film has typically been adopted as a channel layer of a thin film transistor, which is an example of an electronic device. However, when a polycrystalline silicon film is used, electron scattering at the polycrystalline grain boundary limits electron mobility, so as to cause variation in transistor property. When an amorphous silicon film is used, electron mobility is very low and an element tends to deteriorate with time, so as to cause extremely low element reliability. In this regard, an oxide semiconductor has been attracting interests, which is higher in electron mobility than an amorphous silicon film and has less variation in transistor property than a polycrystalline silicon film. Moreover, not only an oxide semiconductor, but also an oxide conductive material or an oxide insulator made of an oxide is an essential technical element for realization of an electronic device made of only an oxide, for example, and thus is attracting very high industrial interests.

There has been recently an active attempt to produce an electronic device on a flexible resin substrate in accordance with a low-energy production process such as a printing method. There is an advantage that a semiconductor layer can be patterned directly on a substrate in accordance with a printing method or the like and no etching step is thus required for patterning.

As disclosed in Patent Documents 1 to 3, there has been an attempt to produce a coated flexible electronic device including a conductive polymer or an organic semiconductor, for example.

PRIOR ART DOCUMENTS

Patent Documents

Patent Document 1: JP Patent Publication (Kokai) No. 2007-134547A
Patent Document 2: JP Patent Publication (Kokai) No. 2007-165900A
Patent Document 3: JP Patent Publication (Kokai) No. 2007-201056A Non-Patent Document Non-patent Document 1: SID 2015 DIGEST, p. 1135

SUMMARY OF THE INVENTION

Problems to be Solved by the Invention

While the industry and consumers demand various information terminals and information appliances, a semiconductor is required to operate at higher speed, to be stable for a long period of time, and to apply a less environmental load. However, the conventional technique typically includes a vacuum process, a process according to the photolithography technique, or the like, which requires a relatively long time period and/or expensive equipment. Therefore, these processes lead to very low utilization efficiency of raw materials and production energy. This is not preferred from the industrial and mass productivity perspectives. It is very difficult to form layers under current conditions by applying the above printing method, such as gravure printing, screen printing, offset printing, or ink jet printing to silicon semiconductors or other semiconductors that have been mainly used to date. Even in a case where any one of the conductive polymer and the organic semiconductor disclosed in Patent Documents 1 to 3 is adopted, the electrical property and stability thereof remain insufficient. In addition, the term "layer(s)" in this application conceptually includes a layer as well as a film. Similarly, the term "film" in this application conceptually includes a film as well as a layer.

Formation of layers by the above various printing methods, and various semiconductor elements and electronic devices produced using a functional solution or a functional paste are now attracting large attention in the industry in terms of flexibilization of the electronic device as well as from the industrial and mass productivity perspectives mentioned above.

There is, however, a difference between the thickness of a layer formed in accordance with a printing method (particularly, a screen printing method) and the necessary thickness of a layer for a semiconductor element, for example. Specifically, a relatively thick layer is formed for patterning according to a printing method whereas the necessary thickness of a layer for a semiconductor element is generally very thin. A paste or a solution used in a printing method (e.g., an oxide precursor including a compound of metal to be oxidized into a metal oxide dispersed in a solution containing a binder) has viscosity suitable for patterning. The viscosity is thus adjusted by the added binder. The inventors of this application confirmed that particularly when a thin layer configuring a semiconductor element (typically an oxide semiconductor layer, an oxide conductive material layer, or an oxide insulator layer) is formed by a printing method or the like using a paste or a solution containing a binder added thereto, a situation can take place where the stringiness of the binder cannot be controlled as appropriate. Such a case is problematic in that a good pattern being tolerable for use in a semiconductor element or suitable for production of a semiconductor element cannot be formed. More specifically, a problem of disturbing a desired pattern can arise, since, in a process for forming an oxide precursor layer by a printing method, precursors are partially drawn out into strands from the patterned precursor layer on a substrate.

When the above oxide precursor is patterned by a printing method, for example, the shape of the thus formed pattern should be maintained. Accordingly, forming a pattern that is unlikely to change with time is another object required particularly for the printing method.

Solutions to the Problems

The inventors of this application performed detailed analyses on a process of forming various metal oxides from a liquid material and particularly on a process of pattern formation of a gelatinous layer (hereinafter, also referred to as "gel layer") obtained from the above paste or solution. As a result, the inventors found that, before the stage of solidifying or sintering the gel layer, specifically, the stage prior to annealing treatment as the main annealing, the properties of the binder itself or the paste or solution to which the binder has been added have a significant influence upon patterning of the gel layer.

The inventors of this application confirmed through many trials and errors as well as analyses that the use of a binder made of an aliphatic polycarbonate(s) having a molecular weight(s) within a specific range or having specific stringiness can contribute to the realization of a desirably patterned gel layer having the degree of thinness sufficient for use in an electronic device or a semiconductor element.

The inventors of this application thoroughly studied to realize a desirably patterned gel layer based on another point of view. Specifically, after a pattern is once formed, the above binder is regarded as an impurity in view of a metal oxide that is to be finally obtained, and is thus subjected to decomposition or removal. Hence, the time during which the binder is needed is merely temporary. The inventors of this application conducted research and analyses based not on a concept that the shape of the once formed pattern should be maintained for relatively a long time period, but on a concept that the pattern should be maintained for a short time from the formation of the pattern to the decomposition or removal thereof. As a result, it was revealed that devising a solvent in the above paste or solution can contribute to the above realization of a desirably patterned gel layer.

It was also confirmed that an oxide layer obtained by annealing the gel layer that is an oxide precursor can be easily formed by a low-energy production process represented by a printing method. Specifically, the above view points and means can each contribute to further improvement in the performance of a semiconductor element and an electronic device provided with a desired thin metal oxide layer formed using a low-energy production process, as well as production technology therefor.

The present invention has been devised in accordance with each of the above points and various analyses.

In addition, the inventors of this application have decomposed and removed a binder more reliably by annealing for the formation of the above metal oxide, as well as realized in the past a facility or a method for obtaining an oxide semiconductor layer (for example, International Publication WO/2015/019771). Accordingly, such a facility or a method can be applied at least partially, also in this application. The technology and technical ideas that have been studied or developed so far are not always required to be applied in this application. However, applying the technology and technical ideas can contribute to further improvement in the performance of the above semiconductor element and electronic device, and production technology therefor, in addition to achieving the above technical objects at least partially.

The "process from a liquid state to a gel state" in this application is typically exemplified by a state where a binder and a solvent are removed by heat treatment but a compound of metal (e.g., a ligand) to be oxidized into a metal oxide is not decomposed. The "process from a gel state to a solidified state or a sintered state" is typically exemplified by a state where the ligand is decomposed and oxygen and the metal to be oxidized into a metal oxide are substantially bonded.

In an exemplary oxide precursor according to the present invention, a compound of metal to be oxidized into a metal oxide is dispersed in a solution containing a binder (possibly including inevitable impurities) made of aliphatic polycarbonates, and an aliphatic polycarbonate(s) having a molecular weight(s) of 6000 or more and 400000 or less constitutes 80% by mass or more of all the aliphatic polycarbonates.

The use of this oxide precursor makes it possible to appropriately control the stringiness of a binder for a layer that is formed by a printing method, for example, since the molecular weight of the aliphatic polycarbonate(s) constituting 80% by mass or more of all the aliphatic polycarbonates serving as a paste is 6000 or more and 400000 or less. As a result, a good pattern can be obtained for the oxide precursor.

Furthermore, in another exemplary oxide precursor of the present invention, a compound of metal to be oxidized into a metal oxide is dispersed in a solution containing a binder (possibly including inevitable impurities) made of aliphatic polycarbonates, and the aliphatic polycarbonates have the value of $L/(D \times v \times \eta)$ of 0.25 $mm^{-1}Pa^{-1}$ or more, when a cylindrical bar made of polytetrafluoroethylene and having a diameter "D" is dipped in a collection of the aliphatic polycarbonates having a zero-shear viscosity $\eta$ as measured using a rheometer (TA Instruments, Model, AR-2000EX), the cylindrical bar is raised at a velocity "v", and then the length "L" of a strand drawn out from the outermost surface of the collection of the aliphatic polycarbonate is measured.

According to the research and analyses conducted by the inventors of this application, the inventors have found that regarding an oxide precursor, the stringiness of a binder for a layer to be formed by a printing method, for example, can be controlled as appropriate when aliphatic polycarbonates serving as a paste satisfy the numeric range based on the above formula (specifically, $L/(D \times v \times \eta)$)). Therefore, a good pattern can be obtained for an oxide precursor when the above numeric range is satisfied.

An exemplary oxide layer of the present invention is formed by annealing a layer of an oxide precursor, wherein a compound of metal to be oxidized into a metal oxide is dispersed in a solution containing a binder (possibly including inevitable impurities) made of aliphatic polycarbonates, and an aliphatic polycarbonate(s) having a molecular weight(s) of 6000 or more and 400000 or less constitutes 80% by mass or more of all the aliphatic polycarbonates.

The oxide layer makes it possible to appropriately control the stringiness of a binder for the layer to be formed by a printing method, for example, since the molecular weight(s) of an aliphatic polycarbonate(s) constituting 80% by mass or more of all the aliphatic polycarbonates serving as a paste in the precursor of the oxide layer is 6000 or more and 400000 or less. As a result, a good pattern can be formed for the oxide precursor, so that an oxide layer with a good pattern can be obtained.

Moreover, another exemplary oxide layer of the present invention is formed by annealing an oxide precursor layer, wherein a compound of metal to be oxidized into a metal oxide is dispersed in a solution containing a binder (possibly including inevitable impurities) made of aliphatic polycarbonates, and said aliphatic polycarbonates have the value of $L/(D \times v \times \eta)$ of 0.25 $mm^{-1}Pa^{-1}$ or more, when a cylindrical bar made of polytetrafluoroethylene and having a diameter "D" is dipped in a collection of the aliphatic polycarbonates having a zero-shear viscosity η as measured using a rheometer (TA Instruments, Model, AR-2000EX), the cylindrical bar is raised at a velocity "v" and then the length "L" of a strand drawn out from the outermost surface of the collection of the aliphatic polycarbonate is measured.

The inventors have found that regarding the oxide layer that the stringiness of a binder for a layer to be formed by a printing method, for example, can be controlled as appropriate when aliphatic polycarbonates serving as a paste in the oxide layer precursor satisfy the numeric range based on the above formula. Therefore, an oxide layer with a good pattern can be obtained since the oxide precursor layer can be patterned successfully when the above numeric range is satisfied.

An exemplary method of producing an oxide layer of the present invention involves: a precursor layer forming step for forming, by a printing method, an oxide precursor layer, wherein a compound of metal to be oxidized into a metal oxide is dispersed in a solution containing a binder (possibly including inevitable impurities) made of aliphatic polycarbonates, and an aliphatic polycarbonate(s) having a molecular weight(s) of 6000 or more and 400000 or less constitutes 80% by mass or more of all the aliphatic polycarbonates; and an annealing step for annealing the precursor layer.

The method of producing an oxide layer makes it possible to appropriately control the stringiness of a binder for a layer to be formed by a printing method, for example, since the molecular weight(s) of an aliphatic polycarbonate(s) constituting 80% by mass or more of all the aliphatic polycarbonates serving as a paste is 6000 or more and 400000 or less.

Moreover, another exemplary method of producing an oxide layer of the present invention involves: a precursor layer forming step for forming, by a printing method, an oxide precursor layer, wherein a compound of metal to be oxidized into a metal oxide is dispersed in a solution containing a binder (possibly including inevitable impurities) made of aliphatic polycarbonates, and said aliphatic polycarbonates have the value of $L/(D \times v \times \eta)$ of 0.25 $mm^{-1}Pa^{-1}$ or more, when a cylindrical bar made of polytetrafluoroethylene and having a diameter "D" is dipped in a collection of the aliphatic polycarbonates having a zero-shear viscosity η as measured using a rheometer (TA Instruments, Model, AR-2000EX), the cylindrical bar is raised at a velocity "v" and then the length "L" of a strand drawn out from the outermost surface of the collection of the aliphatic polycarbonate is measured; and an annealing step for annealing the precursor layer.

According to the research and analyses conducted by the inventors of this application, the inventors have found that regarding the oxide precursor that the stringiness of a binder for a layer to be formed by a printing method, for example, can be controlled as appropriate when aliphatic polycarbonates serving as a paste satisfy the numeric range based on the above formula. Therefore, an oxide precursor layer with a good pattern can be formed by satisfying the above numeric range.

The term "metal oxide" in this application conceptually includes an oxide semiconductor, an oxide conductive material, or an oxide insulator. In addition, an oxide semiconductor, an oxide conductive material, and an oxide insulator are relative concepts in view of electroconductivity and require no strict distinction. If metal oxides are supposed to be of the same type, they can be recognized by a person skilled in the art as oxide semiconductors or as oxide conductive materials or oxide insulators, depending on various device requirements. The term "substrate" in this application is not limited to a base in a plate shape but includes a base and a base material in different modes. Furthermore, the term "application" in each of the embodiments to be descried later in this application indicates forming a layer on a substrate in accordance with a low-energy production process such as typically a printing method.

Effects of the Invention

An oxide precursor of the present invention makes it possible to appropriately control the stringiness of a binder made of aliphatic polycarbonates for a layer to be formed by a printing method, for example, so that a good pattern can be obtained for the oxide precursor. Moreover, an oxide layer of the present invention makes it possible to appropriately control the stringiness of a binder made of aliphatic polycarbonates for a layer to be formed by a printing method, for example. As a result, the oxide precursor can be successfully patterned, so that an oxide layer with a good pattern can be obtained.

According to a method of producing an oxide layer of the present invention, it is possible to appropriately control the stringiness of a binder made of aliphatic polycarbonates, so that a good pattern can be obtained for the oxide precursor.

BRIEF DESCRIPTION OF THE DRAWINGS

FIG. 1 shows typical examples of optical photomicrographs of good patterns realized according to a first embodiment of the present invention.

FIG. 2A shows typical examples of optical photomicrographs of unfavorable patterns formed according to the first embodiment of the present invention.

FIG. 2B shows typical examples of optical photomicrographs of good patterns formed according to the first embodiment of the present invention.

FIG. 3A is a graph showing the relationship between each sample and evaluation parameters indicating stringiness according to the first embodiment of the present invention.

FIG. 3B is a graph showing the relationship between each sample and evaluation parameters indicating stringiness according to the first embodiment of the present invention.

FIG. 4A is a graph showing the contact angle between a base material and a solution and the expansion ratio of the solution on the base material with respect to changes in the concentration of 2-nitropropane at 30 seconds after the placement of the solution containing aliphatic polycarbonates on the base material according to the first embodiment of the present invention.

FIG. 4B is a graph showing the contact angle between a base material and a solution and the expansion ratio of the solution on the base material with respect to changes in the concentration of 2-nitropropane at 120 seconds after the placement of the solution containing aliphatic polycarbonates on the base material according to the first embodiment of the present invention.

FIG. 5 is a schematic sectional view showing a process in a method of producing a thin film transistor according to a second embodiment of the present invention.

FIG. 6 is a schematic sectional view showing a process in a method of producing a thin film transistor according to the second embodiment of the present invention.

FIG. 7 is a schematic sectional view showing a process in a method of producing a thin film transistor according to the second embodiment of the present invention.

FIG. 8 is a schematic sectional view showing a process in a method of producing a thin film transistor according to the second embodiment of the present invention.

FIG. 9 is a schematic sectional view showing a process in a method of producing a thin film transistor according to the second embodiment of the present invention.

FIG. 10 is a schematic sectional view showing a process in a method of producing a thin film transistor according to the second embodiment of the present invention.

FIG. 11 is a graph showing the TG-DTA properties of an indium-containing solution as an example of a material configuring an oxide semiconductor precursor for the formation of a channel of the thin film transistor according to the second embodiment of the present invention.

FIG. 12A is a graph showing the TG-DTA properties of a polypropylene carbonate solution as an example of a solution containing only a binder as a solute for the formation of a component of the thin film transistor according to the second embodiment of the present invention.

FIG. 12B is a graph showing the TG-DTA properties of an oxide semiconductor precursor for the formation of a component of the thin film transistor according to the second embodiment of the present invention.

FIG. 12C is a graph showing other TG-DTA properties of an oxide semiconductor precursor for the formation of a component of the thin film transistor according to the second embodiment of the present invention.

FIG. 13 is a schematic sectional view showing a process in a method of producing a thin film transistor according to the second embodiment of the present invention.

FIG. 14 is a schematic sectional view showing a process in a method of producing a thin film transistor according to the second embodiment of the present invention.

FIG. 15 is a schematic sectional view showing a process in a method of producing a thin film transistor according to the second embodiment of the present invention.

FIG. 16 is a schematic sectional view showing the entire structure of and a process in a method of producing a thin film transistor according to the second embodiment of the present invention.

FIG. 17 is a schematic sectional view showing a process in a method of producing a thin film transistor in a modification example (2) according to the second embodiment of the present invention.

EMBODIMENTS OF THE INVENTION

An aliphatic polycarbonate, an oxide precursor, an oxide layer, a semiconductor element, and an electronic device, as well as production methods therefor according to the embodiments of the present invention will now be described in detail with reference to the accompanying drawings. In this disclosure, common parts are denoted by common reference signs in all the drawings unless otherwise specified. Furthermore, components according to these embodiments are not necessarily illustrated in accordance with relative scaling in the drawings. Moreover, some of the reference signs may not be indicated for the purpose of easier recognition of the respective drawings.

First Embodiment

1. Oxide Precursor, and Structure of Oxide Layer, as Well as Methods of Producing the Same In this embodiment, aliphatic polycarbonates and a compound of metal to be oxidized into a metal oxide are mixed in the "oxide precursor" according to a typical aspect. Accordingly, in a typical example of this oxide precursor, a compound of metal to be oxidized into a metal oxide is dispersed in a solution containing aliphatic polycarbonates thought to serve as a binder (possibly including inevitable impurities. The same applies to the followings). In addition, aliphatic polycarbonates serving as a binder are regarded, after a pattern is once formed by a printing method, for example, as impurities in view of the metal oxide that is to be finally obtained, so the aliphatic polycarbonates are subjected to decomposition or removal by mainly annealing treatment.

Moreover, in this embodiment, an aliphatic polycarbonate(s) having a molecular weight(s) of 6000 or more and 400000 or less constitutes 80% by mass or more of all the aliphatic polycarbonates. Furthermore, examples of the metal oxide in this embodiment include, an oxide semiconductor, an oxide conductive material, and an oxide insulator.

(Binder and Solution Containing the Binder)

Next, attention is given to a binder in this embodiment, and the binder and a solution containing the binder will be described in detail.

The binder to be used in this embodiment is made of an aliphatic polycarbonate(s) of an endothermic decomposition type with excellent thermal decomposition properties. It is possible to confirm that the thermal decomposition reaction of the binder is an endothermic reaction by differential thermal analysis (DTA). Such aliphatic polycarbonates have a high oxygen content and can be decomposed into low-molecular-weight compounds at a relatively low temperature. The aliphatic polycarbonates thus positively contribute to reduction of impurities represented by carbon impurities remaining in the metal oxide.

An organic solvent adopted as a solution containing a binder is not particularly limited in this embodiment if the organic solvent allows dissolution of aliphatic polycarbonates. Specific examples of the organic solvent include diethylene-glycol-monoethyl ether acetate (hereinafter, also referred to as "DEGMEA"), α-terpineol, β-terpineol, N-methyl-2-pyrrolidone, 2-nitropropane, isopropyl alcohol, diethylene-glycol-monobutyl ether acetate, diethylene glycol monobutyl ether, toluene, cyclohexane, methyl ethyl ketone, dimethyl carbonate, diethyl carbonate, and propylene carbonate. Diethylene glycol monoethyl ether acetate, α-terpineol, N-methyl-2-pyrrolidone, 2-nitropropane, and propylene carbonate among these organic solvents are preferably used because each of these organic solvents has an appropriately high boiling point, has less evaporation at room temperature, and can be uniformly removed during annealing of the oxide precursor. In addition, in this embodiment, the binder in the thus formed pattern is eventually subjected to decomposition or removal as an impurity. From a perspective such that a pattern should be kept for relatively a short time from the formation of the pattern to the decomposition or removal thereof, a mixed solvent of DEGMEA and 2-nitropropane is preferably adopted.

A method of producing an oxide precursor of this embodiment is not particularly limited. For example, an exemplary method that can be adopted involves stirring respective components, the metal oxide, the binder, and the organic solvent, in accordance with a conventionally known stirring method for uniform dispersion and dissolution. According to an adoptable aspect, the precursor can be obtained by stirring an organic solvent containing a metal oxide and a solution containing a binder dissolved in an organic solvent in accordance with a conventionally known stirring method.

Examples of the known stirring method include mixing with use of an agitator, and kneading and mixing by rotation and/or vibration with use of a device such as a mill filled with ceramic balls.

In order for improvement in dispersibility of the metal oxide, a dispersant, a plasticizer, or the like can be further added to the solution containing the binder where desired.

Specific Examples of the Dispersant Include:

polyhydric alcohol esters such as glycerol and sorbitan;

polyetherpolyols such as diethylene glycol, triethylene glycol, dipropylene glycol, tripropylene glycol, polyethylene glycol, and polypropylene glycol; amine such as polyethyleneimine;

(meth)acrylic resins such as polyacrylic acid and polymethacrylic acid; and copolymers of isobutylene or styrene and maleic anhydride, and amine salts thereof.

Specific examples of the plasticizer include polyetherpolyols and phthalate esters.

The method of forming the oxide precursor layer of this embodiment is not particularly limited. A layer is formed by a low-energy production process according to a preferred aspect. More specific examples of the low-energy production process particularly preferred in this embodiment include printing methods such as gravure printing, screen printing, offset printing, or ink jet printing. Further examples of the low-energy production process that can be employed herein include coating methods such as roll coating, die coating, air knife coating, blade coating, spin coating, reverse coating, or gravure coating. In particular, the oxide precursor layer is formed preferably by coating a substrate in accordance with a simple method such as screen printing.

(Aliphatic Polycarbonate)

In each experimental example as described later, polypropylene carbonate is adopted as an example of aliphatic polycarbonates, but examples of the type of aliphatic polycarbonate adopted in this embodiment are not particularly limited. According to a preferably adoptable aspect of this embodiment, an aliphatic polycarbonate obtained by polymerization reaction between epoxide and carbon dioxide is used. Adoption of such an aliphatic polycarbonate obtained by polymerization reaction between epoxide and carbon dioxide exerts an effect such that an aliphatic polycarbonate having a desired molecular weight can be obtained, by which endothermic decomposition properties can be improved through the control of the structure of the aliphatic polycarbonate. The aliphatic polycarbonate is preferably at least one member selected from the group consisting of a polyethylene carbonate and a polypropylene carbonate in terms of a high oxygen content and decomposition into a low molecular weight compound at a relatively low temperature. With the use of any of the above aliphatic polycarbonates having a molecular weight within the above numeric range, effects similar to those of this embodiment can be exerted.

The epoxide is not particularly limited if the epoxide undergoes a polymerization reaction with carbon dioxide to form an aliphatic polycarbonate having a structure including aliphatic groups on the main chain. Adoptable examples of the epoxide in this embodiment include ethylene oxide, propylene oxide, 1-butene oxide, 2-butene oxide, isobutylene oxide, 1-pentene oxide, 2-pentene oxide, 1-hexene oxide, 1-octene oxide, 1-decene oxide, cyclopentene oxide, cyclohexene oxide, styrene oxide, vinylcyclohexene oxide, 3-phenylpropylene oxide, 3,3,3-trifluoropropylene oxide, 3-naphthylpropylene oxide, 3-phenoxypropylene oxide, 3-naphthoxypropylene oxide, butadiene monoxide, 3-vinyloxypropylene oxide, and 3-trimethylsilyloxypropylene oxide. Among these epoxides, ethylene oxide and propylene oxide are preferably used in terms of their high polymerization reactivity with carbon dioxide. These epoxides may each be used singly or may be used in combination of two or more thereof.

The aliphatic polycarbonate mentioned above has a mass-average molecular weight of preferably from 5000 to 1000000 and more preferably from 10000 to 500000. The aliphatic polycarbonate having a mass-average molecular weight of less than 5000 may exert insufficient effects as a binder because of influences due to a decrease in viscosity, for example. The aliphatic polycarbonate having a mass-average molecular weight of more than 1000000 may be hard to be handled due to lower dissolubility of the aliphatic polycarbonate into an organic solvent. In addition, the numerical values of the mass-average molecular weight can be calculated by the following method.

Specifically, a chloroform solution containing the aliphatic polycarbonate at a concentration of 0.5% by mass is prepared and measured using high performance liquid chromatography. After the measurement, the molecular weight is calculated by comparison with polystyrene having a known mass-average molecular weight measured under the identical conditions. The measurement conditions are as follows.

Type: HLC-8020 (Tosoh Corporation)

Column: GPC column (Trade name of Tosoh Corporation: TSK GEL Multipore HXL-M)

Column temperature: 40° C.

Eluate: chloroform

Flow speed: 1 mL/minute

The aliphatic polycarbonate mentioned above can be exemplarily produced by polymerization reaction between the epoxide and carbon dioxide in the presence of a metal catalyst.

A production example of an aliphatic polycarbonate is as follows.

The atmosphere of the system of an autoclave having a volume of 1 L and equipped with a stirrer, a gas introduction tube, and a thermometer was preliminarily replaced with an atmosphere of nitrogen, and was then charged with a reaction solution containing an organozinc catalyst, hexane, and propylene oxide. The atmosphere of the reaction system was then replaced with an atmosphere of carbon dioxide by adding carbon dioxide with stirring, and the autoclave was filled with carbon dioxide until the pressure of the reaction system reached about 1.5 MPa. The temperature of the autoclave was subsequently raised to 60° C. and polymerization reaction was carried out for several hours while supplying carbon dioxide to be consumed by the reaction. After completion of the reaction, the autoclave was cooled and depressurized and its content was filtrated. The filtrated product was then dried under reduced pressure to obtain polypropylene carbonate.

Specific examples of the metal catalyst include an aluminum catalyst and a zinc catalyst. Among these metal catalysts, the zinc catalyst is preferably used in terms of high polymerization activity in polymerization reaction between epoxide and carbon dioxide. An organozinc catalyst is particularly preferred among the zinc catalysts.

Specific Examples of the Organozinc Catalyst Include:

organozinc catalysts such as zinc acetate, diethyl zinc, and dibutyl zinc; and organozinc catalysts obtained by reaction between a zinc compound and compounds such as primary amine, dihydric phenol, divalent aromatic carboxylic acid, aromatic hydroxy acid, aliphatic dicarboxylic acid, and aliphatic monocarboxylic acid.

According to a preferred aspect, an organozinc catalyst among these organozinc catalysts is adopted, which is obtained by reaction of a zinc compound with an aliphatic dicarboxylic acid and an aliphatic monocarboxylic acid, due to higher polymerization activity.

A production example of an organozinc catalyst is as follows.

A four-necked flask equipped with a stirrer, a nitrogen gas introduction tube, a thermometer, and a reflux condenser was charged with zinc oxide, glutaric acid, acetic acid, and toluene. After the atmosphere of the reaction system was replaced with an atmosphere of nitrogen, the temperature of the flask was raised to 55° C. and the materials were stirred at this temperature for 4 hours so as to perform reaction of the respective materials. The temperature of the flask was then raised to 110° C. and the materials were stirred at this temperature for 4 hours so as to cause azeotropic dehydration for removal of only water. The flask was then cooled to room temperature to obtain a reaction solution containing an organozinc catalyst. The organozinc catalyst, which was obtained by partially fractionating and filtrating the reaction solution, was subjected to IR measurement (Thermo Nicolet Japan Inc., trade name: AVATAR360). As a result, no peak based on carboxylic groups was confirmed.

The amount of the metal catalyst used for the polymerization reaction is preferably 0.001 to 20 parts by mass and more preferably 0.01 to 10 parts by mass with respect to 100 parts by mass of the epoxide. The polymerization reaction may be unlikely to progress if the amount of the used metal catalyst is less than 0.001 parts by mass. In contrast, if the amount of the used metal catalyst exceeds 20 parts by mass, effects in accord with the amount of use may not be obtained, which may be economically undesirable.

A reaction solvent to be used as necessary in the polymerization reaction is not particularly limited. Any type of an organic solvent can be adopted as the reaction solvent. Specific examples of the organic solvent include:

aliphatic hydrocarbon solvents such as pentane, hexane, octane, decane, and cyclohexane;

aromatic hydrocarbon solvents such as benzene, toluene, and xylene;

halogenated hydrocarbon solvents such as chloromethane, methylene dichloride, chloroform, carbon tetrachloride, 1,1-dichloroethane, 1,2-dichloroethane, ethyl chloride, trichloroethane, 1-chloropropane, 2-chloropropane, 1-chlorobutane, 2-chlorobutane, 1-chloro-2-methylpropane, chlorobenzene, and bromobenzene; and carbonate solvents such as dimethyl carbonate, diethyl carbonate, and propylene carbonate.

The amount of the used reaction solvent is preferably 500 parts by mass or more and 10000 parts by mass or less with respect to 100 parts by mass of the epoxide in terms of smooth reaction.

The method of the reaction between an epoxide and carbon dioxide in the presence of a metal catalyst is not particularly limited in the polymerization reaction described above. For example, an adoptable method includes charging in an autoclave the epoxide, the metal catalyst, and a reaction solvent as necessary, mixing these components, and then injecting carbon dioxide under pressure for reaction.

The pressure under which the carbon dioxide is used in the polymerization step is not particularly limited. Typically, the pressure is preferably from 0.1 MPa to 20 MPa, more preferably from 0.1 MPa to 10 MPa, and even more preferably from 0.1 MPa to 5 MPa. If the carbon dioxide is used at a pressure exceeding 20 MPa, effects in accord with the amount of use may not be obtained, which may be economically undesirable.

The polymerization reaction temperature in the above polymerization reaction is not particularly limited. The typical polymerization reaction temperature is preferably from 30° C. to 100° C. and more preferably from 40° C. to 80° C. If the polymerization reaction temperature is lower than 30° C., the polymerization reaction may take a long period. In contrast, if the polymerization reaction temperature exceeds 100° C., side reaction may occur with a lower yield. The period of the polymerization reaction is typically preferred to be from 2 to 40 hours, although the period differs depending on the polymerization reaction temperature and cannot be determined generally.

After the completion of the polymerization reaction, the aliphatic polycarbonate may be obtained by filtration or the like, and washing with a solvent or the like as necessary, followed by drying.

[Correlation Between the Molecular Weight of an Aliphatic Polycarbonate, and Stringiness and Shape of Pattern]

The inventors of this application thoroughly analyzed and examined on correlation between the molecular weight of an aliphatic polycarbonate, and stringiness and shape of pattern typically by performing the following experiment. As a result, the inventors of this application confirmed that if an aliphatic polycarbonate(s) having a molecular weight(s) of 6000 or more and 400000 or less, as a typical example of the molecular weight thereof, constitutes 80% by mass or more of all the aliphatic polycarbonates, the stringiness of the oxide precursor can be controlled and a good pattern can be formed. In addition, aliphatic polycarbonates adopted in each of the following examples are polypropylene carbonates (hereinafter, also referred to as "PPC").

(Preparation Step for Each Experiment)

In addition, an example of production of an oxide precursor is as follows. In each of the following experiments, typically, a precursor to be oxidized into an oxide semiconductor, that is, an oxide semiconductor precursor, was adopted.

A flask having a volume of 50 mL was gradually charged with indium acetylacetonate and propionic acid while stirring the mixture to obtain an indium-containing solution eventually serving as an indium oxide.

Next, an eggplant-shaped flask having a volume of 50 mL was charged with polypropylene carbonate dissolved in a mixed solvent of DEGMEA and 2-nitropropane, so as to obtain a 25 wt % polypropylene carbonate solution.

Subsequently, the above indium-containing solution was gradually added into the polypropylene carbonate solution, so as to obtain an oxide semiconductor precursor.

Experimental Example 1

As described in the following (1) to (10), samples were each prepared by dissolving one of 4 types of PPC differing in mass-average molecular weight, or samples were each prepared by dissolving a combination of any 2 types thereof.

(1) Only PPC having a mass-average molecular weight of 30000 (hereinafter, also referred to as "sample A".)

(2) Only PPC having a mass-average molecular weight of 90000 (hereinafter, also referred to as "sample B".)

(3) A mixture of sample A and sample B at a ratio of 1:1 (hereinafter, also referred to as "sample AB".)

(4) Only PPC having a mass-average molecular weight of 230000 (hereinafter, also referred to as "sample C".)

(5) Only PPC having a mass-average molecular weight of 590000 (hereinafter, also referred to as "sample D".)

(6) A mixture of sample C and sample D at a ratio of 1:1 (hereinafter, also referred to as "sample CD".)

(7) A mixture of sample A and sample C at a ratio of 1:1 (hereinafter, also referred to as "sample AC".)

(8) A mixture of sample B and sample C at a ratio of 1:1 (hereinafter, also referred to as "sample BC".)

(9) A mixture of sample A and sample D at a ratio of 1:1 (hereinafter, also referred to as "sample AD".)

(10) A mixture of sample B and sample D at a ratio of 1:1 (hereinafter, also referred to as "sample BD".)

The above samples were subjected to determination of the percentage of an aliphatic polycarbonate(s) having a molecular weight of 6000 or more and 400000 or less in all aliphatic polycarbonates, as described below. Specifically, a chloroform solution containing an aliphatic polycarbonate at a concentration of 0.5% by mass was prepared. The molecular weight distribution was measured by high performance liquid chromatography through comparison with polystyrene having a known molecular weight under the following measurement conditions.

Type: HLC-8020 (Tosoh Corporation)
Column: GPC column (Trade name of Tosoh Corporation: TSK GEL Multipore HXL-M)
Column temperature: 40° C.
Eluate: chloroform
Flow speed: 1 mL/minute The percentage of the area corresponding to the region of the molecular weight of 6000 or more and 400000 or less in the area corresponding to the entire chromatogram region was calculated from the chromatogram obtained by the above method wherein the horizontal axis denotes molecular weight (log molecular weight) and the vertical axis denotes elution ratio (dwt/d (log molecular weight)). The thus obtained results are depicted in Table 1.

TABLE 1

| Sample | Percentage (% by mass) of aliphatic polycarbonate having a molecular weight of 6000-400000 |
|---|---|
| (1) | 81 |
| (2) | 93 |
| (3) | 87 |
| (4) | 79 |
| (5) | 58 |
| (6) | 69 |
| (7) | 80 |
| (8) | 86 |
| (9) | 70 |
| (10) | 76 |

Binders were evaluated for stringiness using the above samples. Specifically, rectangular patterns were formed with the above binders on glass substrates "Eagle XG" (200×150×0.7 tmm$^3$) by a screening printing method.

Subsequently, preliminary annealing was performed at 150° C. for 30 minutes for the pattern in an atmosphere of air, and then the patterns were evaluated for stringiness using an optical microscope, and an atomic force microscope (AFM).

The summary of the above experimental results are shown in Table 2.

TABLE 2

| Sample | Shape of pattern | Stringiness | Height of pattern (μm) |
|---|---|---|---|
| (1) | Good | Good | 1.4 |
| (2) | Good | Good | 1.5 |
| (3) | Good | Good | 1.8 |
| (4) | Good | Bad | 2.6 |
| (5) | Bad | Bad | 4 |
| (6) | Bad | Bad | Unmeasurable |
| (7) | Good | Good | 2.1 |
| (8) | Good | Good | 2.1 |
| (9) | Bad | Bad | 5.3 |
| (10) | Bad | Bad | 5.3 |

"Shape of pattern" in Table 2 indicates the fidelity of a pattern formed using the printing method. Accordingly, the expression "bad" with regard to "shape of pattern" means a situation in which a pattern is not formed to a degree sufficient for use in device production. Conversely, the expression "good" with regard to "shape of pattern" means a situation in which a pattern is reproduced to a degree such that it can be used for device production. Moreover, the expression "bad" with regard to "stringiness" in Table 2 means a state in which strands are drawn out partially from a binder layer on which a pattern has been formed using the printing method, thereby disturbing the desired pattern. Furthermore, the expression "good" with regard to "stringiness" means a state in which almost no or completely no stringiness is observed. In addition, "height of pattern" in Table 2 indicates the highest height of a pattern as measured using an atomic force microscope (AFM). Furthermore, the expression "unmeasurable" with regard to "height of pattern" of Sample (6) means a situation in which substantially no pattern itself was formed.

In addition to Table 2 above, the results of the above (1), (7), and (8) are shown in FIG. 1, as examples of typical optical photomicrographs showing the realization of good patterns. The results of the above (5), (9), and (10) are shown in FIG. 2A as examples of typical optical photomicrographs showing unfavorable patterns formed as a result of uncontrolled stringiness.

As depicted in Table 2, FIG. 1, and FIG. 2A, relatively low-molecular-weight aliphatic polycarbonates, (1) "Sample A", (2) "Sample B", and (3) "Sample AB", and a moderate-molecular-weight aliphatic polycarbonate, (7) "Sample AC" were found to have good "shape of pattern" and "stringiness". In particular, Sample C ((4) in Table) is indicated to have "bad" stringiness in Table 2, however, stringiness was observed only partially on the pattern.

The thus obtained results indicate that "shape of patterning" or "stringiness" becomes worse due to an increase in molecular weight. Meanwhile, for example, a pattern formed by a screen printing method preferably has a "height" at a level or higher. It was also found that the adoption of a significantly low-molecular-weight aliphatic polycarbonate is not preferred in order to achieve "height of pattern" at a level or higher while maintaining good "shape of pattern" and "stringiness".

In addition, the inventors of this application consider the cause of "bad" "shape of patterning" and "bad" "stringiness" of (9) "Sample AD" and (10) "Sample BD" as follows.

As depicted in "height of pattern" in Table 2, each height of pattern (5.3 μm) of (9) "Sample AD" and (10) "Sample BD" is almost the same as the sum of the height of pattern (1.4 μm) of "Sample A" and the height of pattern (4 μm) of "Sample D", or, the sum of the height of pattern (1.5 μm) of "Sample A" and the height of pattern (4 μm) of "Sample D". Accordingly, it is considered that the use of a sample prepared by dissolving PPC alone as a binder results in a situation where a high-molecular-weight aliphatic polycarbonate and a low-molecular-weight aliphatic polycarbonate become immiscible due to namely, phase separation, when a difference in molecular weight between the two exceeds a level. More specifically, there can be a situation where a high-molecular-weight aliphatic polycarbonate is placed on a low-molecular-weight aliphatic polycarbonate, or a situation opposite thereto. Meanwhile, (7) "Sample AC" or (8) "Sample BC" having relatively a small difference in molecular weight were considered to be in a state in which the high-molecular-weight aliphatic polycarbonate and the low-molecular-weight aliphatic polycarbonate are mixed appropriately without undergoing namely, phase separation. This is considered to be the reason of their good "shape of patterning" and "stringiness".

Therefore, the above experimental results can be said to indicate that even when materials of the same type were used, specifically, when a plurality of aliphatic polycarbonates having different mass-average molecular weights were used, simple equalization of the mass-average molecular weights of the aliphatic polycarbonates cannot always lead to a molecular weight appropriate for obtaining good "shape of patterning" and "stringiness".

Each of the above results and the results of examination and analyses made by the inventors of this application concerning other molecular weights together indicate that good "shape of pattern" and "stringiness" can be realized by adopting an aliphatic polycarbonate(s) having a molecular weight(s) of 6000 or more and 400000 or less and constituting 80% by mass or more of all the aliphatic polycarbonates.

Furthermore, the results of the above (1) to (10) were confirmed to correlate with the results of oxide semiconductor precursor samples explained in "preparation step for each experiment" and prepared by dissolving one of 4 types of PPC differing in mass-average molecular weight as a binder, or, oxide semiconductor precursor samples prepared by dissolving a combination of any 2 out of the 4 types of PPC as a binder, in terms of tendency of data. In addition, each oxide semiconductor precursor sample contains a 0.2 mol/kg indium-containing solution at 5% by mass. Moreover, the same number is used for each sample number in Table 3 for easy understanding of the correspondence with (1) to (10) in Table 1.

Specifically, as depicted in Table 3, relatively low-molecular-weight aliphatic polycarbonates, (1) "Sample A", (2) "Sample B", and (3) "Sample AB", and a moderate-molecular-weight aliphatic polycarbonate, (7) "Sample AC" were found to have good "shape of pattern" and "stringiness". Interestingly, relatively high-molecular-weight samples (9) and (10) were also found to have good shape of pattern and stringiness. FIG. 2B shows optical photomicrographs showing the results of (9) and (10) for which good patterns were formed as a result of successful control of stringiness. The reason of the good shape of pattern and stringiness of the samples (9) and (10) may be due to the addition of an indium-containing solution to a sample adopted in Table 2, leading to a slight decrease in PPC concentration as a whole.

TABLE 3

| Sample | Shape of pattern | Stringiness | Height of pattern (μ m) |
|---|---|---|---|
| (1) | Bad | Good | 1 |
| (2) | Bad | Good | Unmeasurable |
| (3) | Good | Good | 1.2 |
| (4) | Bad | Bad | 4.4 |
| (5) | Bad | Bad | Unmeasurable |
| (6) | Bad | Bad | Unmeasurable |
| (7) | Good | Good | 3.2 |
| (8) | Good | Good | 2.6 |
| (9) | Good | Good | 3.7 |
| (10) | Good | Good | 5.3 |

Experimental Example 2

Next, the inventors of this application measured the average length of drawn out strands (mm) and zero-shear viscosity (Pa·s) of samples (1) to (10) used in Experimental example 1 by the following experiment.

In this experiment, first, regarding the average length of drawn-out strands (mm), a cylindrical bar made of polytetrafluoroethylene and having a diameter "D" of 2.9 mm was dipped in a collection of aliphatic polycarbonates, which had been formed using each sample, within a container. When the cylindrical bar was then raised at a velocity "v" of 5 mm/second, and then the length "L" (mm) of a strand drawn out from the outermost surface of the collection of the aliphatic polycarbonate was measured. In addition, the zero-shear viscosity η of each sample was measured using a rheometer (TA Instruments, AR-2000EX). Each of the above values was substituted as an evaluation parameter into the following formula for calculation.

<Formula>

$$\text{"Evaluation parameter" (mm}^{-1}\cdot\text{Pa}^{-1}) = L/(D \times v \times \eta)$$

Table 4 shows the relationship between each sample, and average length of drawn-out strands (mm) and zero-shear viscosity (Pa·s) in this Experimental example. FIG. 3A is a graph showing the relationship between each sample and evaluation parameter representing stringiness in this Experimental example.

TABLE 4

| Sample | Average length of drawn-out strands (mm) | Zero-shear viscosity (Pa · s) | Evaluation parameter (mm$^{-1}$ · Pa$^{-1}$) |
|---|---|---|---|
| (1) | 2.62 | 0.14 | 1.31 |
| (2) | 2.74 | 0.41 | 0.47 |
| (3) | 2.59 | 0.27 | 0.67 |
| (4) | 113.51 | 58.7 | 0.13 |
| (5) | 129.58 | 392.5 | 0.02 |
| (6) | 124.77 | 279.4 | 0.03 |
| (7) | 51.37 | 5.7 | 0.62 |
| (8) | 54.80 | 7.7 | 0.49 |
| (9) | 38.36 | 11.8 | 0.22 |
| (10) | 65.45 | 29.4 | 0.15 |

As depicted in Table 4 and FIG. 3A, when a sample was prepared by dissolving PPC alone as a binder, it was found that good "shape of patterning" and "stringiness" can be achieved if the value of "evaluation parameter" (mm$^{-1}$·Pa$^{-1}$) calculated by the above formula is at least 0.4 mm$^{-1}$Pa$^{-1}$.

Furthermore, as shown in the following Table 5, the results of the above (1) to (10) were confirmed to correlate with the results of oxide semiconductor precursor samples explained in "preparation step for each experiment" prepared by dissolving one of 4 types of PPC differing in mass-average molecular weight as a binder, or, oxide semiconductor precursor samples prepared by dissolving a combination of any 2 out of the 4 types of the same, in terms of tendency of data. Moreover, the same number is used for each sample number in Table 5 below for easy understanding of the correspondence with (1) to (10) in Table 1.

As depicted in Table 4, Table 5, FIG. 3A, and FIG. 3B, the values of the "evaluation parameter" in the results of using the above oxide semiconductor precursor samples were overall higher than those in the results of using samples prepared by dissolving PPC alone as a binder. Therefore, when the results of (9) and (10) and the results of Table 3 to Table 5, and FIG. 3B, as well as FIG. 2B are taken together and examined, it was found that good "shape of patterning" and "stringiness" can be obtained with the value of "evaluation parameter" ($mm^{-1} \cdot Pa^{-1}$) that is 0.25 $mm^{-1} Pa^{-1}$ or more (more strictly, 0.29 $mm^{-1} Pa^{-1}$ or more). In addition, the upper limit of the "evaluation parameter" to achieve good "shape of patterning" and "stringiness" is not particularly limited. However, in order to more reliably achieve the height of pattern, the value of the "evaluation parameter" is preferably 1.2 or less (more strictly, 0.9 or less).

TABLE 5

| Sample | Average length of drawn-out strands (mm) | Zero-shear viscosity (Pa · s) | Evaluation parameter ($mm^{-1} \cdot Pa^{-1}$) |
|---|---|---|---|
| (1) | 2.33 | 0.10 | 1.56 |
| (2) | 2.65 | 0.29 | 0.64 |
| (3) | 2.57 | 0.21 | 0.84 |
| (4) | 92.71 | 54.9 | 0.12 |
| (5) | 126.65 | 340.5 | 0.03 |
| (6) | 115.49 | 96.9 | 0.08 |
| (7) | 29.69 | 2.5 | 0.83 |
| (8) | 36.47 | 3.4 | 0.73 |
| (9) | 30.26 | 7.2 | 0.29 |
| (10) | 65.96 | 15.6 | 0.29 |

(Other Preferable Molecular Weight Ranges of Aliphatic Polycarbonate)

In addition, the molecular weight range of aliphatic polycarbonates in this embodiment is not limited to the numeric range disclosed in each of the above Experimental examples. As a result of analyses made by the inventors of this application, for example, an aliphatic polycarbonate having a molecular weight of 6000 or more and 300000 or less constitutes 75% by mass or more of all the aliphatic polycarbonates in order to more reliably control stringiness and form a good pattern in a further preferred aspect.

Experimental Example 3

(Evaluation of Contact Angle and Expansion Ratio)

As described above, an aliphatic polycarbonate(s) thought to be able to exert functions as a binder is regarded, after a pattern is once formed, as an impurity in view of a metal oxide that is to be finally obtained, and is thus subjected to decomposition or removal. Accordingly, the time during which the binder is needed is namely temporary. However, the inventors have considered that whether or not a solution containing an aliphatic polycarbonate(s) possesses the effect of pattern formation (in other words, balanced viscosity or wettability) for keeping such a temporary time is determined using, as an appropriate indicator, the result of evaluating the contact angle between the solution and a base material when the solution is placed on the base material. Hence, the inventors placed a polypropylene carbonate solution obtained by dissolving polypropylene carbonate (25 wt %) in a mixed solvent of DEGMEA and 2-nitropropane, and then examined, 30 seconds and 120 seconds after placement on the base material (in this Experimental example, glass substrate), how the contact angle between the base material and the solution and expansion ratio of the solution on the base material changed. To facilitate the examination of changes in contact angle, the concentration (wt %) of 2-nitropropane that is an appropriate solvent for an aliphatic polycarbonate(s) was varied, and then each of the above evaluations was performed. Furthermore, the above "expansion ratio" was calculated based on the actual size of a pattern with respect to set values.

FIG. 4A is a graph showing the contact angle between a base material and a solution, and expansion ratio of the solution on the base material with respect to changes in the concentration of 2-nitropropane at 30 seconds after placement of the solution containing aliphatic polycarbonates on the base material. Furthermore, FIG. 4B is a graph showing the contact angle between a base material and a solution and expansion ratio of the solution on the base material with respect to changes in the concentration of 2-nitropropane at 120 seconds after placement of the solution containing aliphatic polycarbonates on the base material.

As depicted in FIG. 4A and FIG. 4B, the contact angle between the base material and the solution, and expansion ratio of the solution on the base material were found to be inversely correlated to each other. Specifically, it was revealed that as the concentration of 2-nitropropane increased, the contact angle increased and the expansion ratio decreased. However, as depicted in FIG. 4B, even when the concentration of 2-nitropropane was high (for example, 75%), there was a case in which the contact angle did not increase. Moreover, it was revealed that particularly the contact angle was observed to tend to sharply increase when the concentration of 2-nitropropane reached a level (typically, 55% or more and 60% or less), as depicted in both FIG. 4A and FIG. 4B.

According to further research and analyses made by the inventors of this application, it was found that a case in which the contact angle exceeds 36° at the stage of 30 seconds after placement, or, a case in which the contact angle exceeds 32° at the stage of 120 seconds after placement results in a situation where a solution containing aliphatic polycarbonates is repelled from the base material, making it difficult to sufficiently form a pattern that can be kept for a temporary time. Accordingly, a solution containing aliphatic polycarbonate is preferably prepared to achieve the above contact angle or less.

On the other hand, it was found that a case in which the contact angle is less than 30° at the stage of 30 seconds after placement, or, a case in which the contact angle is less than 26° at the stage of 120 seconds after placement results in poor reproducibility of a pattern, making it also difficult to sufficiently form a pattern that can be kept for a temporary time. Accordingly, a solution containing aliphatic polycarbonates is preferably prepared to achieve the above contact angle or more.

Furthermore, the results depicted in FIG. 4A and FIG. 4B above were confirmed to correlate with the results of oxide semiconductor precursor samples explained in "preparation step for each experiment", which were each prepared by dissolving one of 4 types of PPC differing in mass-average molecular weight as a binder, or, oxide semiconductor precursor samples prepared by dissolving a combination of any 2 out of the 4 types of the same as a binder.

As described above, it can be confirmed that the result of a solution containing aliphatic polycarbonates, but containing no oxide precursor in the Experimental example was approximately equivalent to that of a solution containing aliphatic polycarbonates and an oxide precursor in the Example.

Second Embodiment

2. Entire Structure of Thin Film Transistor According to the Embodiment

FIGS. 5 to 10 and FIGS. 13 to 16 are each a schematic sectional view of a process in a method of producing a thin film transistor 100 as an exemplary semiconductor element. FIG. 16 is a schematic sectional view of a process in the method of producing the thin film transistor 100 according to this embodiment and an entire structure of the thin film transistor. As depicted in FIG. 16, the thin film transistor 100 according to the present embodiment includes a substrate 10, on which a gate electrode 24, a gate insulator 34, a channel 44, a source electrode 58, and a drain electrode 56 are stacked from the lower side in the mentioned order. A person skilled in the art comprehending the semiconductor element according to this embodiment can fully comprehend provision or achievement of an electronic device including this semiconductor element (e.g. a mobile terminal, an information appliance, or any other publicly known electric appliance), with no particular description. A step for forming various oxide precursor layers, which is described later, is included in the "precursor layer forming step" in this application.

The thin film transistor 100 has the so-called bottom gate structure, although this embodiment is not limited to this structure. A person skilled in the art having ordinary technical knowledge can thus form the top gate structure by changing the order of the steps with reference to the description of this embodiment. Temperatures indicated in this application are surface temperatures of the heating surface of a heater, which comes into contact with a substrate. Patterning of an extraction electrode from each electrode is not depicted in order for simplification of the drawings.

The substrate 10 according to the present embodiment is not particularly limited and is generally included in a semiconductor element. The substrate 10 can be exemplified by any one of various insulating base materials including semiconductor substrates (e.g. a Si substrate, a SiC substrate, and a Ge substrate) such as highly heat resistant glass, a $SiO_2$/Si substrate (i.e. a silicon substrate provided thereon with an oxide silicon film), an alumina ($Al_2O_3$) substrate, an STO (SrTiO) substrate, and an insulating substrate obtained by forming an STO (SrTiO) layer on a surface of a Si substrate with a $SiO_2$ layer and a Ti layer being interposed therebetween. Examples of the insulating substrate include films and sheets made of materials such as polyesters including polyethylene terephthalate and polyethylene naphthalate, polyolefins, cellulose triacetate, polycarbonate, polyamide, polyimide, polyamide imide, polysulfone, aramid, and aromatic polyamide. The substrate is not particularly limited in thickness, and can be 3 μm or more and 300 μm or less. The substrate may be hard or flexible.

(1) Formation of Gate Electrode

In this embodiment, a compound of metal to be oxidized into an oxide conductive material (hereinafter also simply referred to as "oxide conductive material") can be adopted as a material for the gate electrode 24. In this case, the gate electrode 24 of this embodiment is formed by annealing a layer of an oxide conductive material precursor (hereinafter, also referred to as "oxide conductive material precursor layer") in which an oxide conductive material (possibly including inevitable impurities. The same applies to oxides of other materials in addition to the oxide of this material.) is dispersed in a solution containing a binder made of aliphatic polycarbonates. In this embodiment, as depicted in FIG. 5, a gate electrode precursor layer 22 can be formed by applying a gate electrode precursor solution that is a starting material onto a $SiO_2$/Si substrate that is a base material (hereinafter, also simply referred to as "substrate") 10 by a low-energy production process (for example, a printing method or a spin coating method).

Subsequently, an annealing step for annealing the gate electrode precursor layer 22 in air for a predetermined time period (for example, 10 minutes to 1 hour) at 450° C. to 550° C. is performed, for example. As a result, as depicted in FIG. 6, the gate electrode 24 is formed on the substrate 10. In addition, the thickness of the layer of the gate electrode 24 in this embodiment is about 100 nm, for example.

Here, the above oxide conductive material can be exemplified by a material having a structure (typically a complex structure) in which a ligand is coordinated with a metal to be oxidized into an oxide conductive material. Examples of the oxide conductive material according to this embodiment can include a metal organic acid salt, a metal inorganic acid salt, a metal halide, and any metal alkoxide. Moreover, an example of a metal to be oxidized into an oxide conductive material is ruthenium (Ru). In this embodiment, a gate electrode precursor solution prepared using a solution as a starting material, which has been prepared by dissolving ruthenium (III) nitrosylacetate in a mixed solvent of propionic acid and 2-aminoethanol containing a binder made of aliphatic polycarbonates, is subjected to the above irradiation step, for example, an annealing step is performed for annealing in air for a predetermined time period (for example, 10 minutes to 1 hour) at about 450° C. to about 550° C., and then ruthenium oxide that is an oxide conductive material is thus formed, so that the gate electrode 24 can be formed.

In this embodiment, particularly, with the use of a gate electrode precursor solution for which the aliphatic polycarbonates according to the first embodiment are adopted, a good pattern can be formed by a printing method when the gate electrode precursor layer 22 is patterned. More specifically, this makes it possible to appropriately control the stringiness of aliphatic polycarbonates that can serve as a binder in a gate electrode precursor solution, so that a good pattern can be formed for the gate electrode precursor layer 22.

In this embodiment, instead of the above gate electrode 24, high melting metal such as platinum, gold, silver, copper, aluminum, molybdenum, palladium, ruthenium, iridium, or tungsten, a metal material such as an alloy thereof, a $p^+$-silicon layer, or an $n^+$-silicon layer can be applied, for example. In this case, the gate electrode 24 can be formed on the substrate 10 in accordance with a known sputtering technique or a known CVD technique.

(2) Formation of Gate Insulator

Furthermore, in this embodiment, a gate insulator 34 can be formed by annealing a precursor layer of an oxide insulator (hereinafter, also referred to as an "oxide insulator precursor layer"), in which a compound of metal to be oxidized into an oxide insulator (also simply referred to as "oxide insulator") is dispersed in a solution containing a binder made of aliphatic polycarbonates.

Specifically, as depicted in FIG. 7, a gate insulator precursor layer 32 is formed by applying the above oxide insulator precursor onto the gate electrode 24 in accordance with a low-energy production process (e.g. a printing method or a spin coating method).

The gelatinous gate insulator precursor layer 32 is then subjected to the annealing (main annealing) step for annealing at about 450° C. to about 550° C. for a predetermined time period (e.g. 10 minutes to 1 hour) in air, for example, thereby forming an oxide of lanthanum (La) and zirconium (Zr), which is an oxide insulator. As a result, as depicted in FIG. 8, the gate insulator 34 can be formed. In addition, the thickness of the layer of the gate insulator 34 of this embodiment ranges from about 100 nm to about 250 nm, for example.

An example of the above oxide insulator is a material having a structure (typically a complex structure) wherein a ligand is coordinated with a metal to be oxidized into an oxide insulator. Examples of the oxide insulator of this embodiment can include a metal organic acid salt, a metal inorganic acid salt, a metal halide, and any metal alkoxide, or, other organic acid salts, inorganic acid salts, halides, or various alkoxides.

In addition, a typical example of the oxide insulator is an oxide including lanthanum (La) and zirconium (Zr). This oxide can be adopted as the gate insulator 34. In this embodiment, a first solution was prepared by dissolving lanthanum acetate (III) in propionic acid (solvent) containing a binder made of aliphatic polycarbonates, and a second solution was prepared by dissolving zirconium butoxide in propionic acid (solvent) containing a binder made of aliphatic polycarbonates. A gate insulator precursor solution prepared as a starting material by mixing the first solution and the second solution was subjected to the above irradiation step, for example, and then subjected to the annealing step for annealing in air for a predetermined time period (for example, 10 minutes to 1 hour) at about 450° C. to about 550° C., so that an oxide insulator can be formed.

In this embodiment, particularly, with the use of an oxide insulator precursor for which the aliphatic polycarbonates according to the first embodiment are adopted, a good pattern can be formed by a printing method when the gate insulator precursor layer 32 is patterned. More specifically, this makes it possible to appropriately control the stringiness of aliphatic polycarbonates that can serve as a binder in an oxide insulator precursor, so that a good pattern can be formed for the gate insulator precursor layer 32.

Moreover, in this embodiment, oxide silicon or silicon oxynitride can be applied, for example, instead of the above gate insulator 34. In this case, the gate insulator 34 can be formed on the gate electrode 24 by a known CVD technique, for example.

(3) Formation of Channel

Furthermore, in this embodiment, a channel 44 can be formed by annealing a precursor layer of an oxide semiconductor (hereinafter, also referred to as an "oxide semiconductor precursor layer"), wherein a compound of metal to be oxidized into an oxide semiconductor (also simply referred to as "oxide semiconductor") is dispersed in a solution containing a binder made of aliphatic polycarbonates. In this embodiment, as depicted in FIG. 9, the channel precursor layer 42 can be formed by applying a channel precursor solution; that is, a starting material, onto the gate insulator 34 by a low-energy production process (for example, a printing method or a spin coating method).

Subsequently, the channel precursor layer 22 is subjected to an annealing step described later, so that the channel 44 is formed as depicted in FIG. 10.

An example of the above oxide semiconductor is a material having a structure (typically a complex structure) in which a ligand is coordinated with a metal to be oxidized into an oxide semiconductor. Examples of materials to be used for forming the oxide semiconductor of this embodiment can include a metal organic acid salt, a metal inorganic acid salt, a metal halide, and various metal alkoxides. Examples of a typical oxide semiconductor include an indium oxide (hereinafter, also referred to as "InO"). For example, indium oxide (hereinafter, also referred to as "InO"), which is an oxide semiconductor, can be formed by performing an annealing step, whereby a solution prepared by dissolving indium acetylacetonate in propionic acid (also referred to as "In solution") is annealed at 450° C. to 550° C. for a predetermined time (for example, 10 minutes to 1 hour) in air. As a result, the channel 44 can be formed.

Examples of the metal to be oxidized into an oxide semiconductor include one, two, or more members selected from the group consisting of indium, tin, zinc, cadmium, titanium, silver, copper, tungsten, nickel, indium-zinc, indium-tin, indium-gallium-zinc, antimony-tin, and gallium-zinc. In terms of element performance, stability, and the like, indium-zinc is preferably adopted as the metal to be oxidized into an oxide semiconductor.

In this embodiment, particularly, with the use of a channel precursor solution for which the aliphatic polycarbonates according to the first embodiment are adopted, a good pattern can be formed by a printing method when the channel precursor layer 42 is patterned. More specifically, this makes it possible to appropriately control the stringiness of aliphatic polycarbonates that can serve as a binder in a channel precursor solution, so that a good pattern can be formed for the channel precursor layer 42.

Moreover, in this embodiment, particularly, when the channel 44; that is, an oxide semiconductor layer, is formed, an invention relating to a method of producing metal oxides, which has been devised by the inventors of this application as disclosed in International Publication WO/2015/019771, for example, can be adopted as an appropriate example.

A typical method of forming the channel 44 involves: a precursor layer forming step for forming, on or above a substrate, a layered oxide semiconductor precursor, wherein a compound of metal to be oxidized into an oxide semiconductor is dispersed in a solution containing a binder made of aliphatic polycarbonates; and an annealing step for heating the precursor layer at a first temperature achieving decomposition of 90 wt % or more of the binder, and then annealing the precursor layer at a temperature equal to or higher than a second temperature that is higher than the first temperature, achieves bonding between the metal and oxygen, and has an exothermic peak value in differential thermal analysis (DTA) for the precursor or the metal compound.

<TG-DTA (Thermogravimetry and Differential Heat) Properties>

More specifically, FIG. 11 is a graph indicating an example of TG-DTA properties of an indium-containing solution (In solution) as an example of a material configuring the oxide semiconductor precursor for the formation of the channel of the thin film transistor according to the first embodiment. FIG. 12A is a graph indicating an example of TG-DTA properties of a polypropylene carbonate solution as an example of a solution containing only a binder as a solute for the formation of a component (for example, channel) of a thin film transistor. In addition, TG-DTA properties indicated in FIG. 11 and FIG. 12A, respectively, were measured in an atmosphere of air at a temperature rise rate of 3° C./min. Furthermore, as depicted in FIG. 11 and FIG. 12A, a broken line in FIG. 11 and a thick line in FIG. 12A are the results of thermogravimetry (TG), and a continuous line in FIG. 11 and a thin line in FIG. 12A are the results of differential thermal analysis (DTA).

As observed in the thermogravimetry result indicated in FIG. 11, there is a significant reduction in weight at around 120° C. to 130° C., which is assumed to be due to evaporation of the solvent. As depicted in FIG. 11, an exothermic peak in the graph of the measured differential heat of the In solution was confirmed at around 350° C. It is thus confirmed that indium is in the state of being bonded to oxygen at around 350° C. This temperature of 350° C. thus corresponds to the above second temperature.

As observed in the thermogravimetry result indicated in FIG. 12A, there is a significant reduction in weight at around 120° C. to around 170° C., because of the elimination of the solvent of the polypropylene carbonate solution, and the partial decomposition or elimination of the polypropylene carbonate itself as a binder. The polypropylene carbonate is assumed to be decomposed into carbon dioxide and water by this decomposition. As observed in the result indicated in FIG. 12A, 90 wt % or more of the binder was decomposed and removed at around 255° C. This temperature of 255° C. thus corresponds to the first temperature according to the first embodiment. More specifically, it is found that 95 wt % or more of the binder is decomposed at around 260° C. and most (99 wt % or more) of the binder is decomposed at around 270° C.

The temperature (second temperature) that achieves bonding between the above metal configuring an oxide semiconductor and oxygen and is an exothermic peak value in the differential thermal analysis (DTA) is preferably sufficiently higher than the temperature that achieves decomposition of the binder, or the temperature that achieves decomposition of the binder is preferably sufficiently lower than the temperature (second temperature) having the exothermic peak value. Accordingly, 90 wt % or more (more preferably 95 wt % or more, further preferably 99 wt % or more, and most preferably 99.9 wt % or more) of the binder can be decomposed more reliably. According to the research and analyses conducted by the inventors of this application, a difference between the first temperature and the second temperature is 10° C. or higher, more preferably 50° C. or higher, and further preferably 100° C. or higher, leading to the reduction of impurities represented by carbon impurities remaining in the oxide layer.

The oxide semiconductor is not particularly limited in terms of its phase state. For example, the oxide semiconductor may be in any one of the crystal form, the polycrystal form, and the amorphous form. The present embodiment can also cover a phase state where grown crystal has a branch form or a scale form. Furthermore, the present embodiment is obviously not particularly limited by a patterned shape (e.g. a spherical shape, an elliptical shape, or a rectangular shape).

Furthermore, for reference, FIG. 12B and FIG. 12C indicate an example of TG-DTA properties concerning a sample (oxide semiconductor precursor) prepared by mixing an indium-containing solution and a polypropylene carbonate solution. In addition, the sample indicated in FIG. 12C was prepared by reducing in advance the amount of a solvent component at the initial stage (i.e., before determination of the properties) to a level lower than that of the sample in FIG. 12B, in order to obtain clearer peaks to be detected upon determination of the properties.

As depicted in FIG. 12B and FIG. 12C, peaks indicated by (A) and (B) are observed. According to the research and analyses conducted by the inventors of this application, peak (A) at around 255° C. to 270° C. is considered to result from partial elimination from polypropylene carbonate in the form of carbon dioxide ($CO_2$), and combustion caused by a carbon component remaining within polypropylene carbonate or within a decomposition product of polypropylene carbonate. Therefore, peak (A) is consistent with the exothermic peak at around 255° C. to 270° C. as indicated in FIG. 12A. On the other hand, peak (B) observed at around 350° C. is considered to indicate the bonding of indium with oxygen.

Therefore, it is understood regarding the TG-DTA properties of an oxide semiconductor precursor that the TG-DTA properties of an indium-containing solution and the TG-DTA properties of a polypropylene carbonate solution can coexist separately as different properties. Accordingly, the first temperature and/or the second temperature can be substantially found without preparing an oxide semiconductor precursor.

(Annealing Step for Channel Precursor Layer)

Next, a method of forming the channel 44 is explained more specifically. The method of forming the channel 44 can be applied partially or almost completely to production of the above oxide conductive material or oxide insulator.

As described above, in this embodiment, as depicted in FIG. 9, the channel precursor layer 42 is formed by applying a channel precursor solution onto the gate insulator 34 in accordance with a low-energy production process (e.g., a printing method or a spin coating method). The thickness (wet) of the channel precursor layer 42 as an oxide semiconductor precursor layer is not particularly limited.

The channel precursor layer 42 is subsequently made to be about 600 nm thick by heating, for example, at 150° C. for a predetermined period (e.g. three minutes) in the preliminary annealing (also referred to as the "first preliminary annealing") step. The first preliminary annealing step is performed mainly for fixation of the channel precursor layer 42 on the gate insulator 34, and can thus be not performed if the second preliminary annealing step to be described later is performed.

The second preliminary annealing step (drying step) at a predetermined temperature (first temperature) is subsequently performed in the present embodiment for decomposition of the binder in the channel precursor layer 42. In the second preliminary annealing step according to the present embodiment, the binder is heated at the first temperature that achieves decomposition of 90 wt % or more of the binder. Through the second preliminary annealing step and main annealing (the annealing step) to be described later, impurities such as carbon impurities originally included particularly in the binder can mostly be eliminated eventually in the channel precursor layer 42. In order to more reliably reduce remaining impurities such as carbon impurities originally included particularly in the binder in the channel 44, the first temperature preferably achieves decomposition of 95 wt % or more of the binder, and more preferably achieves decomposition of 99 wt % or more of the binder.

The second preliminary annealing step is not limited to include drying at normal temperature under normal pressure. For example, the second preliminary annealing step can include treatment such as heating or decompressing such as drying by heating, decompression drying, or decompression drying by heating, as long as the substrate, the gate insulator, and the like are not adversely affected. The second preliminary annealing step can possibly influence the increase or decrease in surface roughness of the oxide semiconductor layer. Because behavior during drying differs depending on the solvent, conditions such as the temperature (first temperature) in the second preliminary annealing step are set appropriately in accordance with the type of the solvent.

The second preliminary annealing according to the present embodiment can be exemplified by heating the channel precursor layer 42 at a temperature in the range of from 180° C. or higher to 300° C. or lower for a predetermined period (e.g. 30 minutes). The above preliminary annealing is performed in an oxygen atmosphere or in the atmosphere (hereinafter, also collectively called an "atmosphere containing oxygen"), for example. According to an adoptable aspect, the second preliminary annealing step is performed in a nitrogen atmosphere.

Main annealing is subsequently performed in the "annealing step" by annealing the channel precursor layer 42 in an atmosphere containing oxygen, for example, for a predetermined time period at 200° C. or higher, more preferably at 300° C. or higher, or further preferably in terms of electrical properties at 500° C. or higher. As depicted in FIG. 10, the channel 44 is formed as an oxide semiconductor layer on the gate insulator 34. The oxide semiconductor layer after main annealing is eventually 0.01 μm or more and 10 μm or less in typical thickness. It is noted that the oxide semiconductor layer is unlikely to have cracks even in a case where the thus formed extremely thin film has a thickness of about 0.01 μm (i.e. about 10 nm).

The annealing step is performed at a preset temperature (second temperature) not less than the temperature that achieves decomposition of the ligand of an oxide semiconductor in the oxide semiconductor forming process and bonding between the metal and oxygen, and has the exothermic peak value in the differential thermal analysis (DTA) to be described later. This annealing step is performed to highly reliably decompose and/or remove the binder, the dispersant, and the organic solvent in the channel precursor layer 42. According to a preferred aspect in terms of more reliable reduction of impurities represented by carbon impurities remaining in the oxide semiconductor layer having been mainly annealed, the second temperature is higher than the first temperature by 10° C. or higher. When the second temperature is higher than the first temperature by 50° C. or higher, such remaining impurities can be still more reliably reduced. The second temperature is most preferred to be higher than the first temperature by 100° C. or higher in terms of achievement of controllability and/or reduction of thickness of the final oxide semiconductor layer as well as reduction of the remaining impurities. Meanwhile, the maximum difference between the second temperature and the first temperature is not particularly limited.

According to analysis conducted by the applicants of this application, the binder is mostly decomposed when heated at the first temperature, so that almost no decomposition of the binder takes place and a reaction almost specialized for bonding between the metal and oxygen is performed in the subsequent annealing step (main annealing) at the second temperature. Ideally, cracks will be unlikely generated even in a very thin layer as described above by differentiating the effects achieved by the first temperature and the second temperature.

None of the first preliminary annealing step, the second preliminary annealing step, and main annealing (the annealing step) described above is particularly limited in terms of its heating/annealing method. The heating method can be exemplified by a conventional heating method with use of a thermostat, an electric furnace, or the like. Particularly in a case where the substrate is less heat-resistant, it is preferred to adopt a method of heating/annealing only the oxide semiconductor layer by means of ultraviolet rays, electromagnetic waves, or a lamp for prevention of heat transfer to the substrate.

In the channel 44 forming process, aliphatic polycarbonates can not only reduce or eliminate decomposition products remaining in the oxide semiconductor layer after annealing decomposition, but also contribute to accurate formation of the oxide semiconductor layer. According to a preferred aspect of this embodiment, aliphatic polycarbonates are adopted.

The inventors of this application also found through research that the final thickness of the channel 44 can be controlled in this embodiment by varying the weight ratio of the binder and the compound of metal to be oxidized into an oxide semiconductor, or varying the concentration of the binder or the metal compound. For example, it was found that the channel 44 having a thickness ranging from 10 nm to 50 nm, which is regarded as a very thin layer, can be formed with no cracks. Not only the above thin layer, but also a layer having a thickness of 50 nm or more can be formed relatively easily by appropriately adjusting the thickness of the channel precursor layer 42, the weight ratio, or the like. The layer of a channel has generally a thickness of 0.01 μm (i.e. 10 nm) or more and 1 μm or less. The oxide semiconductor precursor and the oxide semiconductor layer according to this embodiment, which can control the final thickness of the channel 44, are thus regarded as suitable materials for configuring a thin film transistor.

Furthermore, when adopting the oxide semiconductor precursor according to the present embodiment, the oxide semiconductor precursor layer, which may be considerably thick (e.g. 10 μm or more) at an initial stage, can be made extremely thin (e.g. 10 nm to 100 nm) after annealing because the binder and the like are decomposed highly reliably in the subsequent annealing step. It is noted that even such a thin layer has no cracks or highly reliably reduced cracks. It was found that the oxide semiconductor precursor and the oxide semiconductor layer according to the present embodiment, which can initially have sufficient thickness and can eventually be thinned extremely, are very suitable in a low-energy production process or an imprinting process to be described later. Adoption of the oxide semiconductor layer, which is extremely thin but has no cracks or highly reliably reduced cracks, will extremely improve stability of the thin film transistor 100 according to the present embodiment.

The oxide semiconductor layer configuring the channel can be improved in electrical properties and stability in the present embodiment by appropriately adjusting the type of the oxide semiconductor, combinations, and a ratio for mixing with the binder.

(4) Formation of Source Electrode and Drain Electrode

As depicted in FIG. 13, after a resist film 90 that is patterned in accordance with a known photolithography technique is subsequently formed on the channel 44, an ITO layer 50 is formed on the channel 44 and the resist film 90 in accordance with a known sputtering technique. An exemplary target material according to this embodiment is ITO containing 5 wt % of tin dioxide ($SnO_2$) and the ITO layer 50 is formed under a condition of from room temperature to 100° C. When the resist film 90 is subsequently removed, the drain electrode 56 and the source electrode 58 configured of the ITO layer 50 are formed on the channel 44, as depicted in FIG. 14.

As depicted in FIG. 15, after the resist film 90 patterned in accordance with a known photolithography technique is subsequently formed on the drain electrode 56, the source electrode 58, and the channel 44, the exposed channel 44 is removed in accordance with a known dry etching technique using argon (Ar) plasma with the resist film 90, a part of the drain electrode 56, and a part of the source electrode 58 serving as masks. As depicted in FIG. 16, the patterned channel 44 is thus formed and the thin film transistor 100 is produced.

Furthermore, in this embodiment, a method of forming a drain electrode pattern and a source electrode pattern using paste silver (Ag) or paste ITO (indium tin oxide) according to a printing method, for example, instead of the above drain electrode 56 and source electrode 58, is an adoptable aspect. Moreover, a gold (Au) or aluminum (Al) drain electrode pattern and a gold (Au) or aluminum (Al) source electrode pattern formed by a known evaporation method may also be employed instead of the drain electrode 56 and the source electrode 58.

Modification Example (1) of Second Embodiment

A thin film transistor according to this embodiment is similar to the thin film transistor 100 according to the second embodiment in terms of the production steps and the structures, except that the ultraviolet irradiation step is additionally performed after the step of annealing (main annealing) the channel in the second embodiment. Accordingly, explanations that overlap with those in the second embodiment will not be given herein.

In this embodiment, ultraviolet rays having spectrum peaks at wavelengths of 185 nm and 254 nm were applied using a known low pressure mercury lamp (SAMCO Inc., UV ozone cleaner, model: UV-300h-E) after the channel annealing step (main annealing) in the second embodiment. The steps similar to those in the method of producing the thin film transistor 100 according to the second embodiment were performed subsequently. The wavelengths of ultraviolet rays are not particularly limited in this embodiment. Similar effects can be exerted even with ultraviolet rays having wavelengths other than 185 nm or 254 nm.

Modification Example (2) of Second Embodiment

Also, in the second embodiment, as depicted in FIG. 15, the channel 44 is formed by patterning by a known photolithography technique and dry etching. However, for example, when a printing method represented by a screen printing method is adopted, the channel precursor layer 42 can be desirably patterned without performing a known photolithography technique and dry etching, as depicted in FIG. 17. This is a preferred aspect since the adoption of the printing method requires no step of forming a pattern shown in FIG. 15. In addition, steps following FIG. 17 are each performed in accordance with respective steps in the second embodiment, excluding steps based on the known photolithography technique and dry etching depicted in FIG. 15. Similarly, also in the case of each layer (e.g., gate electrode 24 and gate insulator 34) other than the channel in a thin film transistor 100, pattern formation is possible without using a known photolithography technique and dry etching, when a printing method represented by a screen printing method, for example, is adopted.

Other Embodiments

The above embodiments each relate to a thin film transistor having the so-called inversely-staggered structure. However, these embodiments are not limited to this structure. For example, effects similar to those of the respective embodiments can be exerted not only by the thin film transistor having the staggered structure, but also by a thin film transistor having the so-called planar structure including a source electrode, a drain electrode, and a channel disposed on an identical plane. According to a different adoptable aspect, the substrate is provided thereon with the channel (i.e. the oxide semiconductor layer) according to each of the above embodiments.

As described above, the above embodiments and experimental examples have been disclosed not for limiting the present invention but for describing these embodiments and experimental examples. Furthermore, modification examples made within the scope of the present invention, inclusive of other combinations of the embodiments, will also be included in the scope of the patent claims.

INDUSTRIAL APPLICABILITY

The present invention can be applied broadly to the fields of electronic devices including a mobile terminal, an information appliance, a sensor, or any other publicly known electric appliance including various semiconductor elements, MEMS (Micro Electro Mechanical Systems) or NEMS (Nano Electro Mechanical Systems), and medical devices, for example.

DESCRIPTION OF REFERENCE SIGNS

10 Substrate
24 Gate electrode
32 Gate insulator precursor layer
34 Gate insulator
42 Channel precursor layer
44 Channel
50 ITO layer
56 Drain electrode
58 Source electrode
90 Resist film
100 Thin film transistor

The invention claimed is:
1. An oxide precursor, wherein:
a compound of metal to be oxidized into a metal oxide is dispersed in a solution containing a binder (possibly including inevitable impurities) made of aliphatic polycarbonates; and
an aliphatic polycarbonate having a molecular weight of 6000 or more and 400000 or less constitutes 80% by mass or more of all said aliphatic polycarbonates.
2. An oxide precursor, wherein:
a compound of metal to be oxidized into a metal oxide is dispersed in a solution containing a binder (possibly including inevitable impurities) made of aliphatic polycarbonates; and
said aliphatic polycarbonates have the value of $L/(D \times v \times \eta)$ of 0.25 $mm^{-1}$ $Pa^{-1}$ or more when a cylindrical bar made of polytetrafluoroethylene and having a diameter "D" is dipped in a reservoir of said aliphatic polycarbonates having a zero-shear viscosity "$\eta$" as measured using a rheometer (TA Instruments, AR-2000EX), said cylindrical bar is raised at a velocity "v" and then the length "L" of a strand drawn out from the outermost surface of said collection of said aliphatic polycarbonate is measured.

3. The oxide precursor according to claim 1, wherein
the contact angle between said solution and a base material is 30° or more and 36° or less at 30 seconds after said solution is placed on the base material, or
the contact angle between said solution and a base material is 26° or more and 32° or less at 120 seconds after said solution is placed on the base material.

4. The oxide precursor according to claim 1, wherein:
said solution contains a binder (possibly including inevitable impurities) made of aliphatic polycarbonates; and
said aliphatic polycarbonates have the value of $L/(D \times v \times \eta)$ of 0.25 $mm^{-1}$ $Pa^{-1}$ or more, when a cylindrical bar made of polytetrafluoroethylene and having a diameter "D" is dipped in a collection of said aliphatic polycarbonates having a zero-shear viscosity "$\eta$" as measured using a rheometer (TA Instruments, AR-2000EX), said cylindrical bar is raised at a velocity "v" and then the length "L" of a strand drawn out from the outermost surface of said collection of said aliphatic polycarbonate is measured.

5. The oxide precursor according to claim 1, wherein said aliphatic polycarbonates are each an aliphatic polycarbonate obtained by polymerizing an epoxide and carbon dioxide.

6. The oxide precursor according to claim 1, wherein said aliphatic polycarbonates are at least one member selected from the group consisting of a polyethylene carbonate and a polypropylene carbonate.

7. An oxide layer, which is formed by annealing an oxide precursor layer wherein:
a compound of metal to be oxidized into a metal oxide is dispersed in a solution containing a binder (possibly including inevitable impurities) made of aliphatic polycarbonates; and
an aliphatic polycarbonate having a molecular weight of 6000 or more and 400000 or less constitutes 80% by mass or more of all said aliphatic polycarbonates.

8. An oxide layer, which is formed by annealing an oxide precursor layer wherein:
a compound of metal to be oxidized into a metal oxide is dispersed in a solution containing a binder (possibly including inevitable impurities) made of aliphatic polycarbonates; and
said aliphatic polycarbonates have the value of $L/(D \times v \times \eta)$ of 0.25 $mm^{-1}$ $Pa^{-1}$ or more, when a cylindrical bar made of polytetrafluoroethylene and having a diameter "D" is dipped in a collection of said aliphatic polycarbonates having a zero-shear viscosity "$\eta$" as measured using a rheometer (TA Instruments, AR-2000EX), said cylindrical bar is raised at a velocity "v" and then the length "L" of a strand drawn out from the outermost surface of said collection of said aliphatic polycarbonate is measured.

9. The oxide layer according to claim 7, wherein
the contact angle between said solution and a base material is 30° or more and 36° or less at 30 seconds after said solution is placed on the base material or
the contact angle between said solution and a base material is 26° or more and 32° or less at 120 seconds after said solution is placed on the base material.

10. A semiconductor element, comprising the oxide layer according to claim 7.

11. An electronic device comprising the oxide layer according to claim 9.

12. A method of producing an oxide layer, comprising:
a precursor layer forming step for forming, by a printing method, an oxide precursor layer wherein
a compound of metal to be oxidized into a metal oxide is dispersed in a solution containing a binder (possibly including inevitable impurities) made of aliphatic polycarbonates,
and an aliphatic polycarbonate having a molecular weight of 6000 or more and 400000 or less constitutes 80% by mass or more of all said aliphatic polycarbonates; and
an annealing step for annealing said precursor layer.

13. A method of producing an oxide layer, comprising:
a precursor layer forming step for forming, by a printing method, an oxide precursor layer wherein
a compound of metal to be oxidized into a metal oxide is dispersed in a solution containing a binder (possibly including inevitable impurities) made of aliphatic polycarbonates, and
said aliphatic polycarbonates have the value of $L/(D \times v \times \eta)$ of 0.25 $mm^{-1}$ $Pa^{-1}$ or more, when a cylindrical bar made of polytetrafluoroethylene and having a diameter "D" is dipped in a collection of said aliphatic polycarbonates having a zero-shear viscosity "$\eta$" as measured using a rheometer (TA Instruments, AR-2000EX), said cylindrical bar is raised at a velocity "v" and then the length "L" of a strand drawn out from the outermost surface of said collection of said aliphatic polycarbonate is measured; and
an annealing step for annealing said precursor layer.

14. A method of producing a semiconductor element, comprising:
said precursor layer forming step according to claim 12; and
said annealing step according to claim 12.

15. The oxide precursor according to claim 2, wherein
the contact angle between said solution and a base material is 30° or more and 36° or less at 30 seconds after said solution is placed on the base material, or
the contact angle between said solution and a base material is 26° or more and 32° or less at 120 seconds after said solution is placed on the base material.

16. The oxide precursor according to claim 2, wherein:
said solution contains a binder (possibly including inevitable impurities) made of aliphatic polycarbonates; and
said aliphatic polycarbonates have the value of $L/(D \times v \times \eta)$ of 0.25 $mm^{-1}$ $Pa^{-1}$ or more, when a cylindrical bar made of polytetrafluoroethylene and having a diameter "D" is dipped in a collection of said aliphatic polycarbonates having a zero-shear viscosity "$\eta$" as measured using a rheometer (TA Instruments, AR-2000EX), said cylindrical bar is raised at a velocity "v" and then the length "L" of a strand drawn out from the outermost surface of said collection of said aliphatic polycarbonate is measured.

17. The oxide layer according to claim 8, wherein
the contact angle between said solution and a base material is 30° or more and 36° or less at 30 seconds after said solution is placed on the base material or
the contact angle between said solution and a base material is 26° or more and 32° or less at 120 seconds after said solution is placed on the base material.

18. A semiconductor element, comprising the oxide layer according to claim 8.

19. An electronic device comprising the semiconductor element according to claim 10.

20. A method of producing a semiconductor element, comprising:
said precursor layer forming step according to claim 13; and
said annealing step according to claim 13.

* * * * *